(12) United States Patent
Lee et al.

(10) Patent No.: US 12,408,531 B2
(45) Date of Patent: Sep. 2, 2025

(54) TRANSPARENT DISPLAY DEVICE

(71) Applicant: LG Display Co., Ltd., Seoul (KR)

(72) Inventors: Seongku Lee, Paju-si (KR); Binn Kim, Paju-si (KR)

(73) Assignee: LG Display Co., Ltd., Seoul (KR)

(*) Notice: Subject to any disclaimer, the term of this patent is extended or adjusted under 35 U.S.C. 154(b) by 510 days.

(21) Appl. No.: 17/976,501

(22) Filed: Oct. 28, 2022

(65) Prior Publication Data

US 2023/0209952 A1    Jun. 29, 2023

(30) Foreign Application Priority Data

Dec. 24, 2021  (KR) .................. 10-2021-0187318

(51) Int. Cl.
  *H10K 59/35*   (2023.01)
  *H10D 86/40*   (2025.01)
  *H10D 86/60*   (2025.01)
  *H10K 59/121*  (2023.01)
  *H10K 59/131*  (2023.01)

(52) U.S. Cl.
  CPC ......... *H10K 59/353* (2023.02); *H10D 86/441* (2025.01); *H10D 86/481* (2025.01); *H10D 86/60* (2025.01); *H10K 59/1213* (2023.02); *H10K 59/1216* (2023.02); *H10K 59/131* (2023.02); *H10K 59/351* (2023.02)

(58) Field of Classification Search
  CPC .. H10K 59/131; H10K 59/351; H10K 59/353; H10D 86/441
  USPC ........................................ 313/498
  See application file for complete search history.

(56) References Cited

U.S. PATENT DOCUMENTS

| | | | |
|---|---|---|---|
| 2016/0202522 A1* | 7/2016 | Lee .................. | G02F 1/133514 349/106 |
| 2016/0291369 A1* | 10/2016 | Park ................. | G02F 1/133514 |
| 2016/0357042 A1* | 12/2016 | Yoon ................ | G02F 1/134309 |
| 2017/0131608 A1* | 5/2017 | Jin .................... | G09G 3/3648 |
| 2017/0287943 A1 | 10/2017 | Ma et al. | |
| 2021/0143373 A1 | 5/2021 | Kim et al. | |
| 2022/0199009 A1* | 6/2022 | Park ................... | H10K 59/131 |
| 2022/0208883 A1* | 6/2022 | Kim .................. | H10K 59/123 |
| 2022/0208887 A1* | 6/2022 | Yoon ................. | H10K 59/122 |
| 2023/0111042 A1* | 4/2023 | Park .................. | H10K 50/86 345/173 |
| 2023/0180553 A1* | 6/2023 | Kim .................. | H10K 59/131 257/72 |

(Continued)

FOREIGN PATENT DOCUMENTS

| | | |
|---|---|---|
| KR | 20180128112 A | 12/2018 |
| KR | 20180129800 A | 12/2018 |
| KR | 20210057522 A | 5/2021 |

*Primary Examiner* — Christopher M Raabe
(74) *Attorney, Agent, or Firm* — Seed Intellectual Property Law Group LLP

(57) ABSTRACT

Disclosed is a transparent display device comprising a plurality of transmission areas, and a plurality of subpixels, wherein the subpixel is disposed between each of the transmission areas, and is configured to include a pixel circuit and a light emitting element having a first electrode connected to the pixel circuit, wherein the first electrode in each of the plurality of subpixels includes a first divided electrode and a second divided electrode separated from each other, and includes a sub-transmission area disposed between the first divided electrode and the second divided electrode.

23 Claims, 15 Drawing Sheets

(56) References Cited

U.S. PATENT DOCUMENTS

2023/0200195 A1* 6/2023 Kim .................. H10K 59/38
                                                      257/40
2024/0206228 A1* 6/2024 Kim .................. H10K 59/878
2025/0098448 A1* 3/2025 Yuan ................. H10K 71/861

* cited by examiner

TRANSPARENT DISPLAY DEVICE

BACKGROUND

Technical Field

The present disclosure relates to a transparent display device.

Description of the Related Art

With the advancement of an information-oriented society, attentions and requirements for a display device configured to display image have been increased in various types. Accordingly, a display device such as a Liquid Crystal Display (LCD), an organic light emitting display (OLED), a Micro Light Emitting Diode (Micro LED), a quantum dot display device (QD), or the like is utilized.

Recently, research has been actively conducted on a transparent display device which displays an image to a user, transmits light, and allows a user to view an object or an image located behind the display device.

The transparent display device includes a display area on which an image is displayed and a non-display area, and the display area may include a non-transmission area and a transmission area capable of transmitting external light. The transparent display device may have a high light transmittance in the display area through the transmission area.

Since the transparent display device includes the transmission area, a light emission area of the transparent display device is relatively smaller than a light emission area of a general display device. Accordingly, when dark points are generated in entire subpixels by foreign materials, a luminance of the transparent display device may be significantly reduced in comparison to that of the general display device.

The above content of the background technology may be retained for a deduction of the present disclosure by inventors, or may be technology information learned by practice of embodiments of the present disclosure. However, the above content of the background technology may be not a prior art published to the general public before an application of the present disclosure.

BRIEF SUMMARY

In some embodiments, the present disclosure provides a transparent display device capable of improving a light transmittance by reducing a portion with a dark point in a light emission area.

In accordance with an aspect of the present disclosure, the above and other benefits can be accomplished by the provision of a transparent display device comprising a plurality of transmission areas, and a plurality of subpixels, wherein the subpixel is disposed between each of the transmission areas, and is configured to include a pixel circuit and a light emitting element having a first electrode connected to the pixel circuit, wherein the first electrode in each of the plurality of subpixels includes a first divided electrode and a second divided electrode separated from each other, and includes a sub-transmission area disposed between the first divided electrode and the second divided electrode.

In addition to the effects of the present disclosure as mentioned above, additional advantages and features of the present disclosure will be clearly understood by those skilled in the art from the description of the present disclosure herein.

BRIEF DESCRIPTION OF THE SEVERAL VIEWS OF THE DRAWINGS

The above and other benefits, features and other advantages of the present disclosure will be more clearly understood from the following detailed description taken in conjunction with the accompanying drawings, in which.

DETAILED DESCRIPTION

Figure 1:
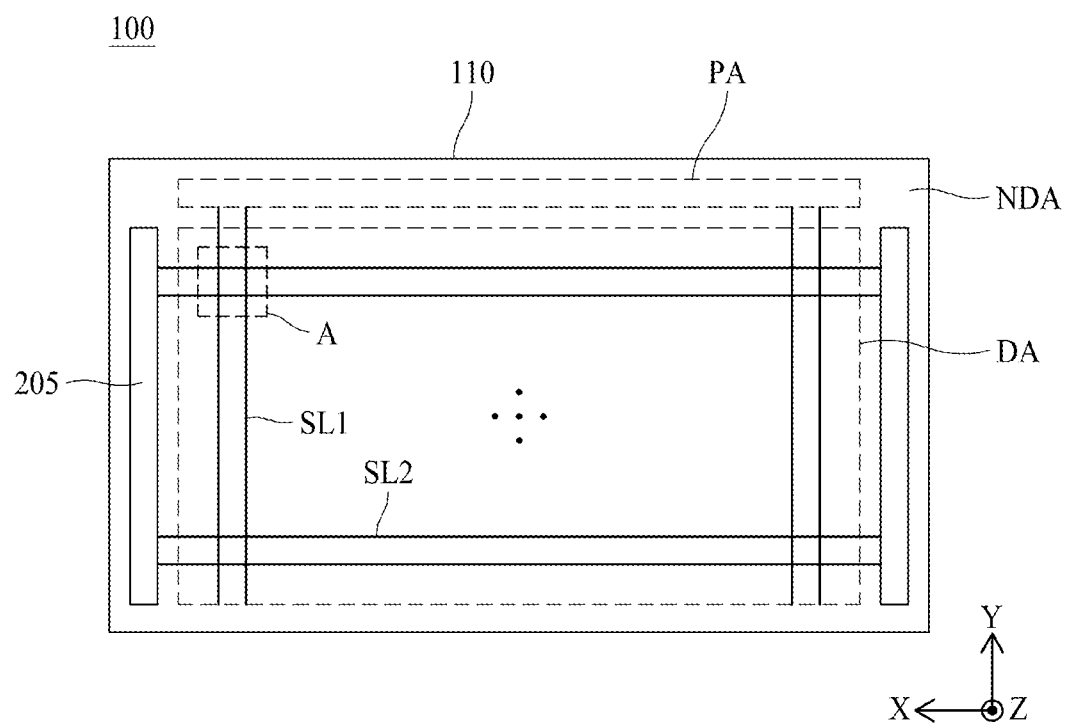
FIG. 1 is a plan view schematically illustrating a transparent display device according to the embodiment of the present disclosure.

Advantages and features of the present disclosure, and implementation methods thereof will be clarified through following embodiments described with reference to the accompanying drawings. The present disclosure may, however, be embodied in different forms and should not be construed as limited to the embodiments set forth herein. Rather, these embodiments are provided so that this disclosure will be thorough and complete, and will fully convey the scope of the present disclosure to those skilled in the art.

A shape, a size, a ratio, an angle, and a number disclosed in the drawings for describing embodiments of the present disclosure are merely an example, and thus, the present disclosure is not limited to the illustrated details. Like reference numerals refer to like elements throughout the specification. In the following description, when the detailed description of the relevant known function or configuration is determined to unnecessarily obscure the important point of the present disclosure, the detailed description may be omitted.

In a case where 'comprise,' 'have,' and 'include' described in the present specification are used, another part may be added unless 'only' is used. The terms of a singular form may include plural forms unless referred to the contrary.

In construing an element, the element is construed as including an error range although there is no explicit description.

In describing a position relationship, for example, when the position relationship is described as 'upon,' 'above,' 'below,' and 'next to,' one or more portions may be arranged between two other portions unless 'just' or 'direct' is used.

In describing a temporal relationship, for example, when the temporal order is described as "after," "subsequent," "next," and "before," a case which is not continuous may be included, unless "just" or "direct" is used.

It will be understood that, although the terms "first," "second," etc., may be used herein to describe various elements, these elements should not be limited by these terms. These terms are only used to partition one element from another. For example, a first element could be termed a second element, and, similarly, a second element could be termed a first element, without departing from the scope of the present disclosure.

The terms "first horizontal axis direction," "second horizontal axis direction," and "vertical axis direction" should not be interpreted only based on a geometrical relationship in which the respective directions are perpendicular to each other, and may be meant as directions having wider directivities within the range within which the components of the present disclosure can operate functionally.

The term "at least one" should be understood as including any and all combinations of one or more of the associated listed items. For example, the meaning of "at least one of a first item, a second item, and a third item" denotes the combination of all items proposed from two or more of the first item, the second item, and the third item as well as the first item, the second item, or the third item.

Features of various embodiments of the present disclosure may be partially or overall coupled to or combined with each other, and may be variously inter-operated with each other and driven technically as those skilled in the art can sufficiently understand. The embodiments of the present disclosure may be carried out independently from each other, or may be carried out together in co-dependent relationship.

Hereinafter, an embodiment of a transparent display device according to the present disclosure will be described in detail with reference to the accompanying drawings. Wherever possible, the same reference numbers will be used throughout the drawings to refer to the same or like parts. Since a scale of each of elements shown in the accompanying drawings is different from an actual scale for convenience of description, the present disclosure is not limited to the shown scale.

FIG. 1 is a plan view schematically illustrating a transparent display device according to one embodiment of the present disclosure.

Hereinafter, the X-axis represents a direction parallel to a scan line, the Y-axis represents a direction parallel to a data line, and the Z-axis represents a height direction of the transparent display device.

The transparent display device according to one embodiment of the present disclosure is implemented as an organic light emitting display OLED device, but may also be implemented as a liquid crystal display LCD device, a micro light emitting diode LED display device, a quantum dot QD display device, and etc.

Referring to FIG. 1, the transparent display device 100 according to the embodiment of the present disclosure may include a transparent display panel 110 including a display area DA for displaying an image by pixels formed thereon, and a non-display area NDA on which an image is not displayed.

In the display area DA of the transparent display panel 110, there are first signal lines SL1, second signal lines SL2, and the pixels. In the non-display area NDA, there are a pad area PA for pads arranged thereon, and at least one gate driver 205.

The first signal lines SL1 may extend in the first direction (or Y-axis direction), and may intersect the second signal lines SL2 in the display area DA. The second signal lines SL2 may extend in the second direction (or X-axis direction). The pixels are disposed in the area where the first signal line SL1 and the second signal line SL2 intersect each other and are configured to emit predetermined light in order to display an image.

The gate driver 205 may be connected to the scan line, to thereby supply a scan signal thereto. The gate driver 205 may be implemented in a gate driver in panel (GIP) method or a tape automated bonding (TAB) method on one outer side or both outer sides of the display area DA of the transparent display panel 110.

The pad area PA of the transparent display panel 110 may be electrically connected to a source drive integrated circuit, a circuit board, or a timing controller connected through a flexible circuit film.

Figure 2:
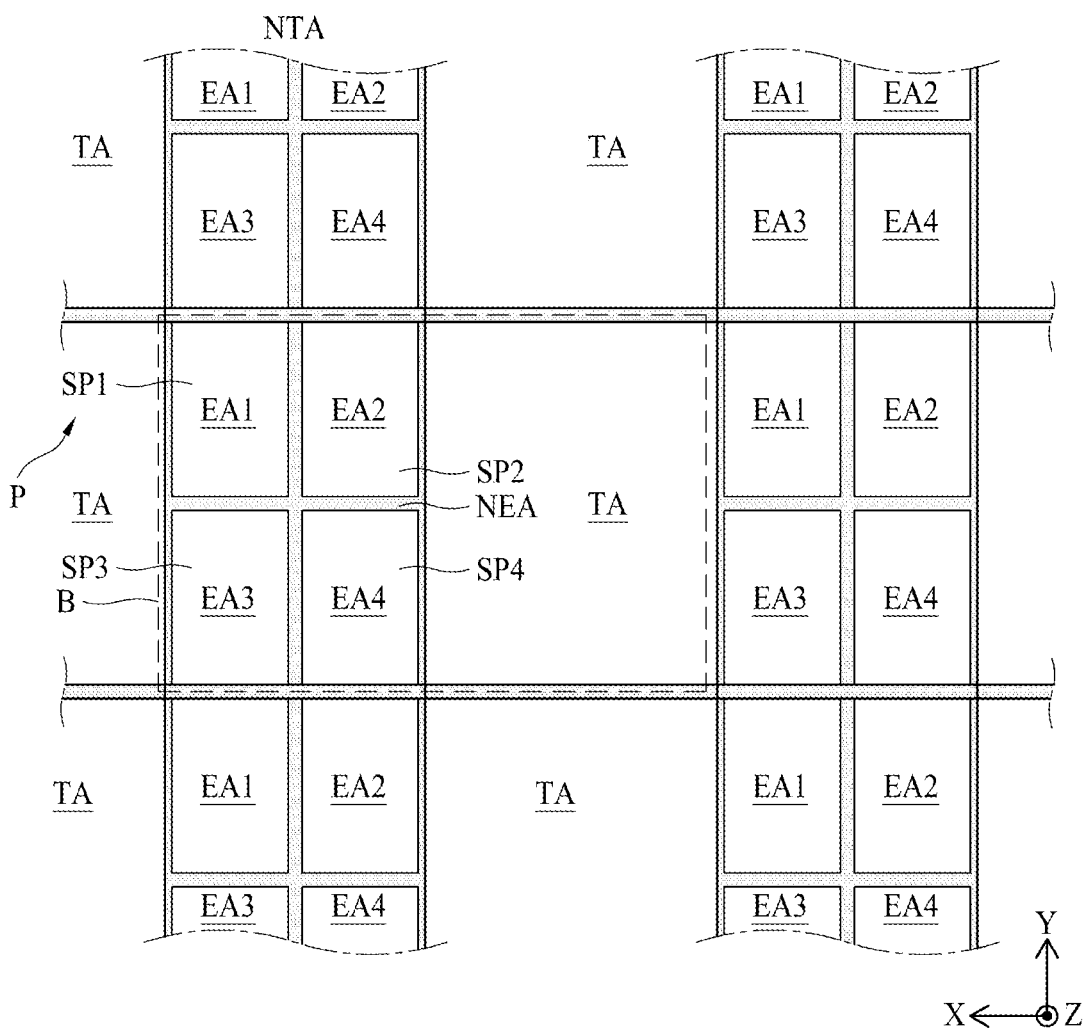
FIG. 2 is a plan view illustrating an example of a pixel disposed in the area A of FIG. 1.
Figure 3:
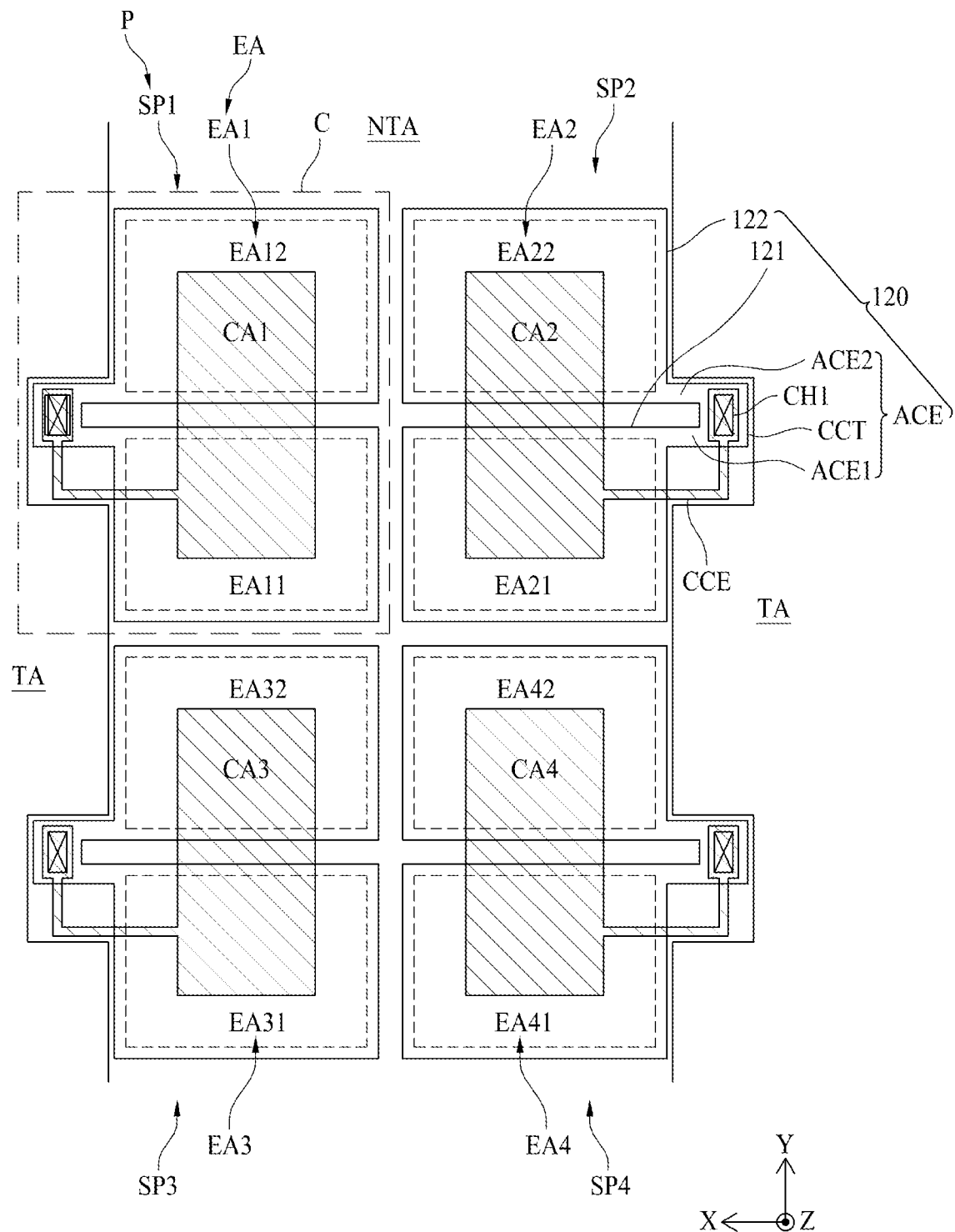
FIG. 3 is a plan view illustrating an example of a pixel electrode included in the area B of FIG. 2.

FIG. 2 is a plan view schematically illustrating an example of the pixel disposed in the area A of FIG. 1, and FIG. 3 is a plan view illustrating an example of the pixel electrode included in the area B of FIG. 2.

Referring to FIGS. 2 and 3 in connection with FIG. 1, the display area DA may include a transmission area TA and a non-transmission area NTA, as shown in FIG. 2. The transmission area TA is the area which passes most of the light incident from the outside, and the non-transmission area NTA is the area which does not transmit most of the light incident from the outside. The transparent display panel 110 may see objects or background located at a rear surface (or back surface) of the transparent display panel 110 owing to the transmission areas TA.

The non-transmission area NTA may be disposed between the adjacent transmission areas TA, and the plurality of pixels P and the plurality of signal lines SL1 and SL2 may be disposed. The plurality of signal lines may include first signal lines SL1 extended in the first direction (or Y-axis direction) in the non-transmission area NTA and second signal lines SL2 extending in the second direction (or X-axis direction). The first signal lines SL1 may include at least one of a pixel power line, a common power line, a data line, and a reference line, and the second signal lines SL2 may include scan lines, but not limited thereto.

Each of the pixels P may include a first subpixel SP1, a second subpixel SP2, a third subpixel SP3, and a fourth subpixel SP4, as shown in FIG. 2. The first subpixel SP1 includes a first light emission area EA1 emitting first color light, the second subpixel SP2 includes a second light emission area EA2 emitting second color light, the third subpixel SP3 may include a third light emission area EA3 emitting third color light, and the fourth subpixel SP4 may include a fourth light emission area EA4 emitting fourth color light. For example, the first to fourth light emission areas EA1, EA2, EA3, and EA4 may emit light of different colors. As one example, the first light emission area EA1 may emit green light, the second light emission area EA2 may emit red light, the third light emission area EA3 may emit blue light, and the fourth light emission area EA4 may emit white light, but not limited thereto. In addition, the arrangement order or arrangement form of each of the subpixels SP1, SP2, SP3, and SP4 may vary widely.

In the transparent display panel 110 according to the embodiment of the present disclosure, the pixel P is disposed between the adjacent transmission areas TA, and the pixel P may include the light emission area EA1, EA2, EA3, and EA4 in which a light emission element is disposed to emit light. Since the size of the non-transmission area NTA is small in the transparent display panel 110, a circuit element may be disposed while being overlapped with the light emission area EA1, EA2, EA3, and EA4. That is, the light emission areas EA1, EA2, EA3, and EA4 may include circuit areas CA1, CA2, CA3, and CA4 in which the circuit element is disposed.

The transparent display panel 110 according to the embodiment of the present disclosure may include light emission areas divided into the plurality of light emission areas EA1, EA2, EA3, and EA4 included in each of the plurality of subpixels SP1, SP2, SP3, and SP4. More specifically, as shown in FIG. 3, the first light emission area EA1 included in the first subpixel SP1 may include a first divided emission area EA11 and a second divided emission area EA12. The second light emission area EA2 included in the second subpixel SP2 may include a first divided emission area EA21 and a second divided emission area EA22. The third light emission area EA3 included in the third subpixel SP3 may include a first divided emission area EA31 and a second divided emission area EA32. The fourth light emission area EA4 included in the fourth subpixel SP4 may include a first divided emission area EA41 and a second divided emission area EA42.

Each of the plurality of subpixels SP1, SP2, SP3, and SP4 may include the light emitting element and each pixel circuit CA1, CA2, CA3, and CA4 including a capacitor and at least one thin film transistor. The at least one thin film transistor may include a driving thin film transistor, a first switching thin film transistor, and a second switching thin film transistor. Also, the light emitting element may include a first electrode 120 (or anode electrode, pixel electrode), a light emitting layer (or organic light emitting layer), and a second electrode (or cathode electrode, common electrode).

Referring to FIG. 3, in case of the transparent display panel 110 according to the embodiment of the present disclosure, the first electrode 120 (or anode electrode, pixel electrode) included in each of the plurality of subpixels SP1, SP2, SP3, and SP4 may be divided into a plurality of divided electrodes 121 and 122 separated from each other.

The first electrode 120 may include the plurality of divided electrodes 121 and 122 divided and separated from each other, and an anode connection portion ACE.

There are at least two or more divided electrodes 121 and 122, and the divided electrodes 121 and 122 may be spaced apart from each other in the first direction (or Y-axis direction) or second direction (or X-axis direction). For example, as shown in FIG. 3, the first electrode 120 may include the first divided electrode 121 and the second divided electrode 122 separated from each other and disposed in parallel to each other with a separation space therebetween, but not limited thereto. It is possible to include the two or more divided electrodes 121 and 122. As the number of the plurality of divided electrodes 121 and 122 is reduced, an aperture ratio may be increased. However, a dark portion caused by foreign materials may be increased, whereby the yield may be lowered. Meanwhile, as the number of the plurality of divided electrodes 121 and 122 is increased, an aperture ratio may be reduced. However, a dark portion caused by foreign materials is decreased, whereby the yield may be improved. Hereinafter, the first electrode 120 including the first divided electrode 121 and the second divided electrode 122 will be described in detail.

The first divided electrode 121 may be disposed in the first divided emission areas EA11, EA21, EA31, and EA41, and the second divided electrode 122 may be disposed in the second divided emission areas EA21, EA22, EA32, and EA42. The first and second divided electrodes 121 and 122 may be spaced apart from each other and may be provided in the same layer. For example, the first divided electrode 121 and the second divided electrode 122 may be provided in the same layer and may be arranged in parallel with each other with a predetermined space therebetween.

According to the embodiment of the present disclosure, the separation space between the first divided electrode 121 and the second divided electrode 122 may correspond to a portion in which an opaque (or non-transmissive) configuration is not disposed, whereby the separation space between the first divided electrode 121 and the second divided electrode 122 and may include a sub-transmission area (or auxiliary transmission area) capable of passing most of light incident from the outside. A detailed description of the sub-transmission area will be described later with reference to FIGS. 4A to 9C.

The anode connection portion ACE is configured to connect the first divided electrode 121 and the second divided electrode 122 to the pixel circuit CA1, CA2, CA3, and CA4. As shown in FIG. 3, the anode connection portion ACE may include a first anode connection portion ACE1 and a second anode connection portion ACE2. Also, the anode connection portion ACE may include a circuit contact portion CCT configured to connect the first anode connection portion ACE1 and the second anode connection portion ACE2 to each other.

The first anode connection portion ACE1 may be disposed between the transmission area TA and the first divided electrode 121. The first anode connection portion ACE1 may extend from the first divided electrode 121 in the direction of the transmission area TA. One end of the first anode connection portion ACE1 is connected to the first divided electrode 121, and the other end of the first anode connection portion ACE1 may be connected to the circuit contact portion CCT.

The second anode connection portion ACE2 may be disposed between the transmission area TA and the second divided electrode 122. The second anode connection portion ACE2 may extend from the second divided electrode 122 in the direction of the transmission area TA. One end of the second anode connection portion ACE2 is connected to the second divided electrode 122, and the other end of the second anode connection portion ACE2 may be connected to the circuit contact portion CCT.

The circuit contact portion CCT may connect the first anode connection portion ACE1 and the second anode connection portion ACE2 to each other. The circuit contact portion CCT may be electrically connected to the pixel circuit CA1, CA2, CA3, and CA4. The circuit contact portion CCT may be electrically connected to the pixel circuit CA1, CA2, CA3, and CA4 through a circuit connection electrode CCE extending from the pixel circuit CA1, CA2, CA3, and CA4. The circuit contact portion CCT may be overlapped with the circuit connection electrode CCE and may be electrically connected to the circuit connection electrode CCE through a first contact hole CH1.

The first anode connection portion ACE1 may be provided in the same layer as the first divided electrode 121 and may be integrally formed as the first divided electrode 121, and the second anode connection portion ACE2 may be provided in the same layer as the second divided electrode 122 and may be integrally formed as the second divided electrode 122. Also, the circuit contact portion CCT may be disposed between the first anode connection portion ACE1 and the second anode connection portion ACE2, and may be provided in the same layer as the first anode connection portion ACE1 and the second anode connection portion ACE2 and may be integrally formed as the first anode connection portion ACE1 and the second anode connection portion ACE2, but not limited to this structure.

At least a portion of each of the pixel circuits CA1, CA2, CA3, and CA4 in the plurality of subpixels SP1, SP2, SP3, and SP4 may be overlapped with the first electrode 120. At least a portion of the pixel circuits CA1, CA2, CA3, and CA4 may be overlapped with the first divided electrode 121 and the second divided electrode 122 of the first electrode 120. For example, as shown in FIG. 3, at least a portion of the pixel circuits CA1, CA2, CA3, and CA4 may be overlapped with the first divided electrode 121, the second divided electrode 122, and the separation space between the first divided electrode 121 and the second divided electrode 122, but not limited to this structure. The pixel circuits CA1, CA2, CA3, and CA4 may be overlapped with any one of the first divided electrode 121 and the second divided electrode 122.

The transparent display panel 110 according to the embodiment of the present disclosure may include a circuit connection electrode CCE for electrically connecting the pixel circuit CA1, CA2, CA3, and CA4 and the first electrode 120 to each other. The circuit connection electrode CCE may extend from the pixel circuit CA1, CA2, CA3, and CA4 and may be electrically connected to the circuit contact portion CCT of the first electrode 120.

One end of the circuit connection electrode CCE may be connected to the pixel circuit CA1, CA2, CA3, and CA4, and the other end of the circuit connection electrode CCE may be connected to the circuit contact portion CCT. The other end of the circuit connection electrode CCE is overlapped with the circuit contact portion CCT and may be electrically connected to the circuit contact portion CCT through a first contact hole CH1. The circuit connection electrode CCE may not overlap the separation space between the first divided electrode 121 and the second divided electrode 122. The circuit connection electrode CCE may be disposed while being overlapped with the first anode connection portion ACE1 or the second anode connection portion ACE2, but not limited thereto.

In the transparent display device 110 according to the embodiment of the present disclosure, the first electrode 120 included in the light emitting element is divided into the first divided electrode 121 and the second divided electrode 122 spaced apart from each other, and the sub-transmission area may be disposed in the separation space between the first divided electrode 121 and the second divided electrode 122. In the transparent display panel 110 according to the embodiment of the present disclosure, even though foreign materials are generated in any one of the first divided electrode 121 and the second divided electrode 122, it is possible to make the corresponding divided electrode be dark by a repairing process, and to normally drive the remaining divided electrode. As a result, it is possible to reduce the area of the light emission area being dark by the foreign materials, and also to improve the light transmittance by the sub-transmission area.

Hereinafter, various examples of the pixel circuit and the sub-transmission area according to the first to sixth embodiments in the transparent display panel 110 according to the present disclosure will be described in detail with reference to FIGS. 4A to 9C.

First Embodiment

Figure 4A:
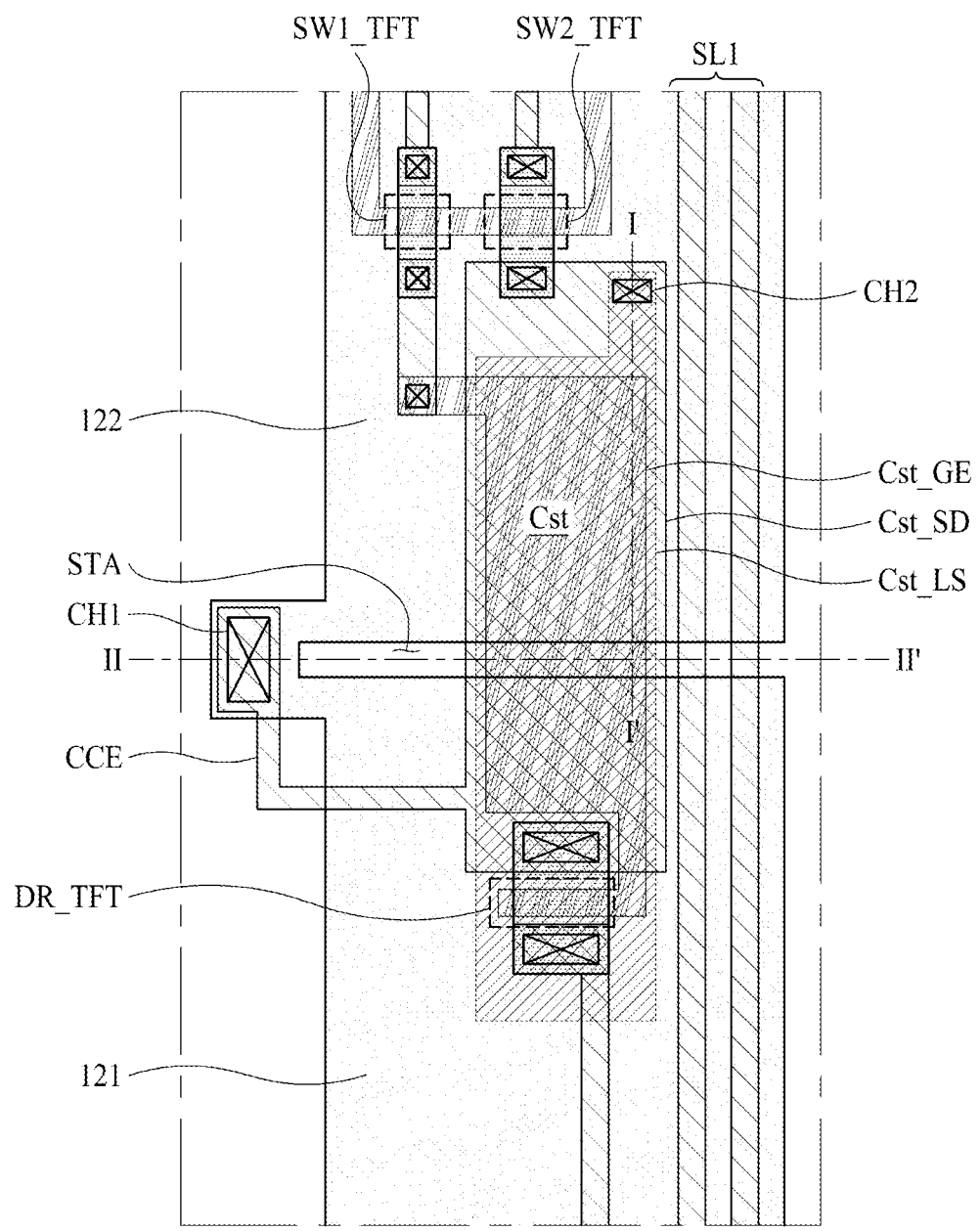
FIG. 4A is a plan view illustrating the first embodiment of a pixel circuit and a sub-transmission area included in the area C of FIG. 3.
Figure 4B:
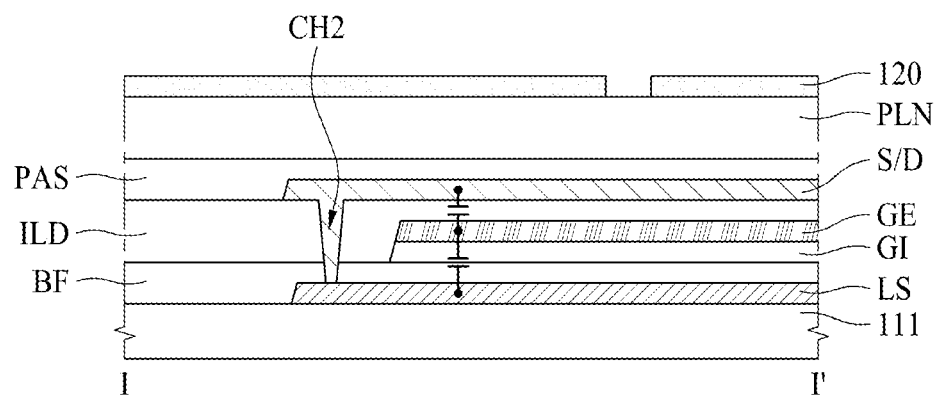
FIG. 4B is a cross-sectional view illustrating an example along I-I' of FIG. 4A.
Figure 4C:
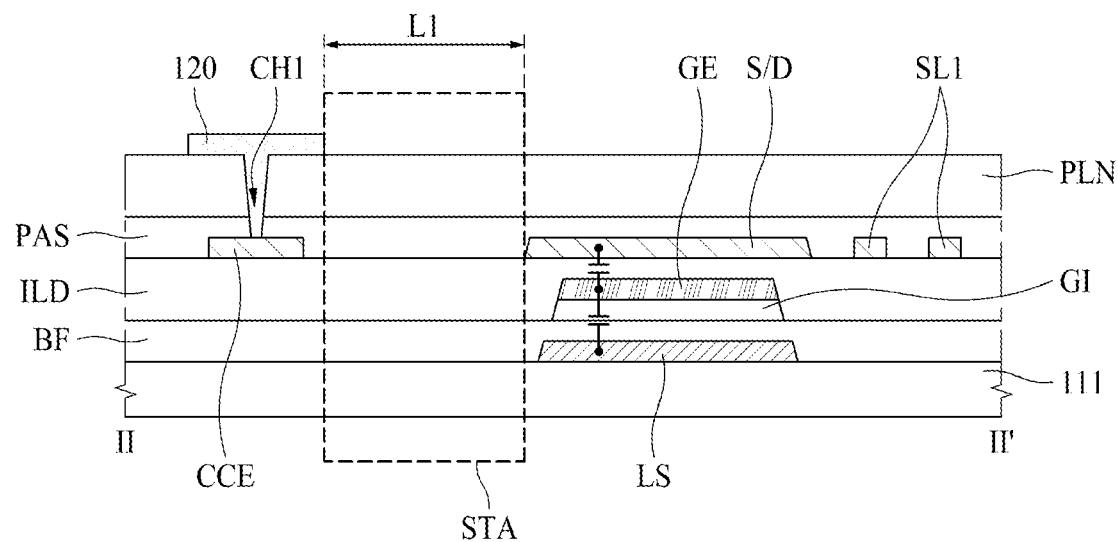
FIG. 4C is a cross-sectional view illustrating an example along II-IF of FIG. 4A.

FIG. 4A is a plan view illustrating the first embodiment of the pixel circuit and the sub-transmission area included in the C of FIG. 3, FIG. 4B is a cross-sectional view illustrating an example along I-I' of FIG. 4A, and FIG. 4C is a cross-sectional view illustrating an example along II-II' of FIG. 4A.

Referring to FIGS. 4A to 4C in connection with FIGS. 1 to 3, each subpixel SP1, SP2, SP3, and SP4 of the transparent display panel 110 according to the first embodiment of the present disclosure may include a first divided electrode 121 and a second divided electrode 122 included in a light emitting element, and at least one thin film transistor DR_TFT, SW1_TFT, and SW2_TFT and a capacitor Cst included in each pixel circuit CA1, CA2, CA3, and CA4. Also, each of the subpixels SP1, SP2, SP3, and SP4 may include at least one first signal line SL1 extending in the first direction (or Y-axis direction). In addition, each of the subpixels SP1, SP2, SP3, and SP4 may include at least one second signal line SL2 extending in the second direction (or X-axis direction). For example, the first signal line SL1 may include at least one of a pixel power line, a common power line, a data line, and a reference line, and the second signal line SL2 may include scan lines, but not limited thereto.

The first divided electrode 121 and the second divided electrode 122 are obtained by dividing the first electrode 120, wherein the first divided electrode 121 and the second divided electrode 122 may be arranged in parallel to each other with a separation space therebetween. A sub-transmission area STA may be disposed between the first divided electrode 121 and the second divided electrode 122. For example, the sub-transmission area STA may be disposed in the separation space between the first divided electrode 121 and the second divided electrode 122. The separation space between the first divided electrode 121 and the second divided electrode 122 may correspond to the area where an opaque (or non-transmissive) other configuration is not disposed, and may include the sub-transmission area STA capable of passing most of light incident from the outside.

At least a portion of the pixel circuit CA1, CA2, CA3, and CA4 in each subpixel SP1, SP2, SP3, and SP4 may be overlapped with the first electrode 120 of the light emitting element. At least a portion of the pixel circuit CA1, CA2, CA3, and CA4 may be overlapped with the first divided electrode 121 and the second divided electrode 122. Also, at least a portion of the pixel circuit CA1, CA2, CA3, and CA4 may be overlapped with the first divided electrode 121, the second divided electrode 122, and the separation space between the first divided electrode 121 and the second divided electrode 122.

The pixel circuits CA1, CA2, CA3, and CA4 may include at least one thin film transistor DR_TFT, SW1_TFT, and SW2_TFT, and the capacitor Cst.

At least one thin film transistor DR_TFT, SW1_TFT, and SW2_TFT may include an active layer ACT, a gate electrode GE, first and second source/drain electrodes S/D, and may include the driving thin film transistor DR_TFT, the first switching thin film transistor SW1_TFT, and the second switching thin film transistor SW2_TFT. The driving thin film transistor DR_TFT may be switched according to a data voltage charged in the capacitor Cst and is configured to generate a data current from a power source supplied from the pixel power line and to supply the data current to the first electrode 120 of the light emitting element. The first switching thin film transistor SW1_TFT may be switched according to a scan signal supplied from a scan line and is configured to charge the data voltage supplied from the data line to the capacitor Cst. The second switching thin film transistor SW2_TFT may sense a threshold voltage deviation of the driving thin film transistor DR_TFT, which may cause deterioration of image quality, according to a sensing signal.

The capacitor Cst may be formed between the gate electrode GE of the driving thin film transistor DR_TFT and the first or second source/drain electrode S/D and may be charged with the data voltage transmitted through the first switching thin film transistor SW1_TFT, and the driving thin film transistor DR_TFT may be driven according to the voltage charged in the capacitor Cst. One end of the capacitor Cst may be connected to the gate electrode GE of the driving thin film transistor DR_TFT and the first or second source/drain electrode S/D of the first switching thin film transistor SW1_TFT, and the other end of the capacitor Cst may be connected to the first or second source/drain electrode S/D of the driving thin film transistor DR_TFT and the first electrode 120. For example, the capacitor Cst may include a first capacitor electrode Cst_LS formed of the same material as a light shielding layer LS, a second capacitor electrode Cst_GE formed of the same material as the gate electrode GE, and a third capacitor electrode Cst_SD formed of the same material as the source/drain electrode S/D, but not limited thereto.

With respect to the separation space between the first divided electrode 121 and the second divided electrode 122, the pixel circuit CA1, CA2, CA3, and CA4 may be divided into a first pixel circuit area overlapped with the first divided electrode 121 and a second pixel circuit area overlapped with the second divided electrode 122. For example, the driving thin film transistor DR_TFT may be disposed in the first pixel circuit area, and the first and second switching thin film transistors SW1_TFT and SW2_TFT may be disposed in the second pixel circuit area. Also, the capacitor Cst may be disposed between the first pixel circuit area and the second pixel circuit area, and may be overlapped with the separation space between the first divided electrode 121 and the second divided electrode 122, but not necessarily.

The transparent display panel 110 according to the first embodiment of the present disclosure may include a circuit connection electrode CCE for electrically connecting the pixel circuit CA1, CA2, CA3, and CA4 and the first electrode 120. The circuit connection electrode CCE may extend from the first or second source/drain electrode S/D of the driving thin film transistor DR_TFT and may be disposed while being overlapped with the circuit contact portion CCT of the first electrode 120. The circuit connection electrode CCE may be electrically connected to the circuit contact portion CCT through a first contact hole CH1. The circuit connection electrode CCE may not overlap the separation space between the first divided electrode 121 and the second divided electrode 122. The circuit connection electrode CCE may be disposed while being overlapped with the first anode connection portion ACE1 or the second anode connection portion ACE2, but not limited thereto.

Referring to FIG. 4B, at least a portion of the capacitor Cst of the transparent display panel 110 according to the first embodiment of the present disclosure may be overlapped with the separation space between the first divided electrode 121 and the second divided electrode 122. For example, the capacitor Cst may include three capacitor electrodes, and may include the first capacitor electrode Cst_LS provided in the same layer as the light shielding layer LS disposed over the substrate 111 and formed of the same material as the light shielding layer LS, the second capacitor electrode Cst_GE provided in the same layer as the gate electrode GE disposed over a buffer film BF and a gate insulating film GI and formed of the same material as the gate electrode GE, and the third capacitor electrode Cst_SD provided in the same layer as the source/drain electrode S/D disposed over an interlayer insulating film ILD and formed of the same material as the source/drain electrode S/D. The first capacitor electrode Cst_LS and the third capacitor electrode Cst_SD may be electrically connected to each other through a second contact hole CH2 penetrating the interlayer insulating film ILD and the buffer film BF, but not limited thereto. For example, the capacitor Cst may be formed of the two capacitor electrodes.

Referring to FIG. 4C, the transparent display panel 110 according to the first embodiment of the present disclosure may include the first electrode 120 disposed over a planarization film PLN over the substrate 111. The first electrode 120 may be electrically connected to the circuit connection electrode CCE through the first contact hole CH1 penetrating the planarization film PLN and a passivation film PAS. The first electrode 120 may include an opaque metal material. For example, the first electrode 120 may be formed a metal material having a high reflectance or a stacked structure of a metal material having a high reflectance and a transparent metal material. For example, the first electrode 120 may be formed of a metal material having high reflectance, such as a stack structure of aluminum and titanium (Ti/Al/Ti), a stack structure of aluminum and ITO (ITO/Al/ITO), Ag alloy, and a stack structure of Ag alloy and ITO (ITO/Ag alloy/ITO). The Ag alloy may be an alloy of silver Ag, palladium Pd, and copper Cu. The first electrode 120 may be an anode electrode.

The first electrode 120 is divided into the first divided electrode 121 and the second divided electrode 122 spaced apart from each other, and the first divided electrode 121 and the second divided electrode 122 may be arranged in parallel to each other with the separation space therebetween. The sub-transmission area STA may be disposed in the separation space between the first divided electrode 121 and the second divided electrode 122. The sub-transmission area STA may correspond to the area where an opaque (or non-transmissive) other configuration is not disposed in the separation space between the first divided electrode 121 and the second divided electrode 122. For example, the sub-transmission area STA may be disposed in an area which is not overlapped with the pixel circuit CA1, CA2, CA3, and CA4. In addition, the sub-transmission area STA may be disposed in an area which is not overlapped with at least one signal line SL1.

The sub-transmission area STA may be the area which excludes a portion overlapped with the pixel circuit CA1, CA2 CA3, and CA4 and the first signal line SL1 in the separation space between the first divided electrode 121 and the second divided electrode 122. As shown in FIG. 4C, the capacitor Cst including the light shielding layer LS of the opaque metal material, the gate electrode GE and the source/drain electrode S/D, and the first signal line SL1 of the opaque metal material may be disposed in the separation space between the first divided electrode 121 and the second divided electrode 122, and the sub-transmission area STA may be the area which excludes the portion overlapped with the capacitor Cst and the first signal line SL1.

The sub-transmission area STA may include a length L1 of the area excluding the portion overlapped with the capacitor Cst and the first signal line SL1 in the separation space between the first divided electrode 121 and the second divided electrode 122.

In the transparent display panel 110 according to the first embodiment of the present disclosure, the first electrode 120 included in the light emitting element is divided into the first divided electrode 121 and the second divided electrode 122, and the sub-transmission area capable of passing most of light incident from the outside, which is not overlapped with the capacitor Cst of the pixel circuit CA1, CA2, CA3, and CA4 and the first signal line SL1, may be disposed in the separation space between the first divided electrode 121 and the second divided electrode 122. Accordingly, the transparent display panel 110 according to the first embodiment of the present disclosure may improve light transmittance through the sub-transmission area STA additionally provided in the transmission area TA.

Second Embodiment

Figure 5A:
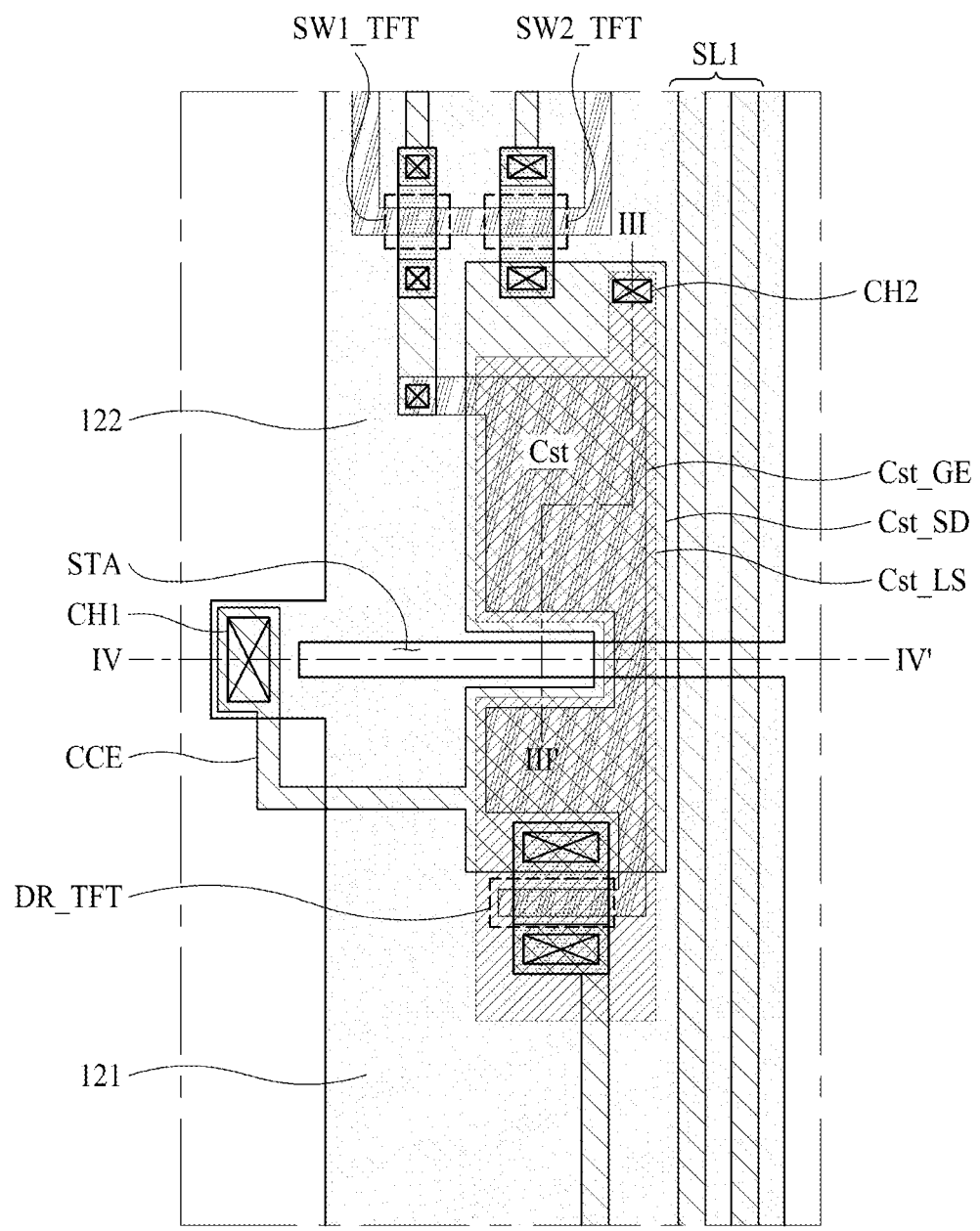
FIG. 5A is a plan view illustrating the second embodiment of a pixel circuit and a sub-transmission area included in the area C of FIG. 3.
Figure 5B:
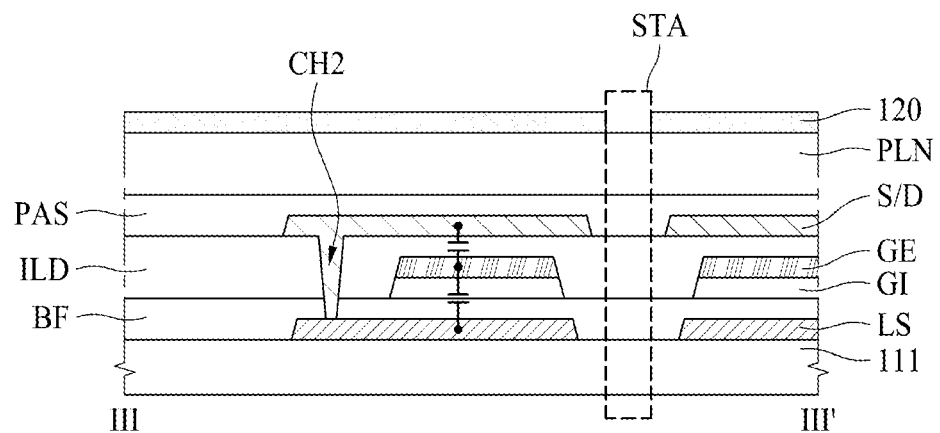
FIG. 5B is a cross-sectional view illustrating an example along of FIG. 5A.
Figure 5C:
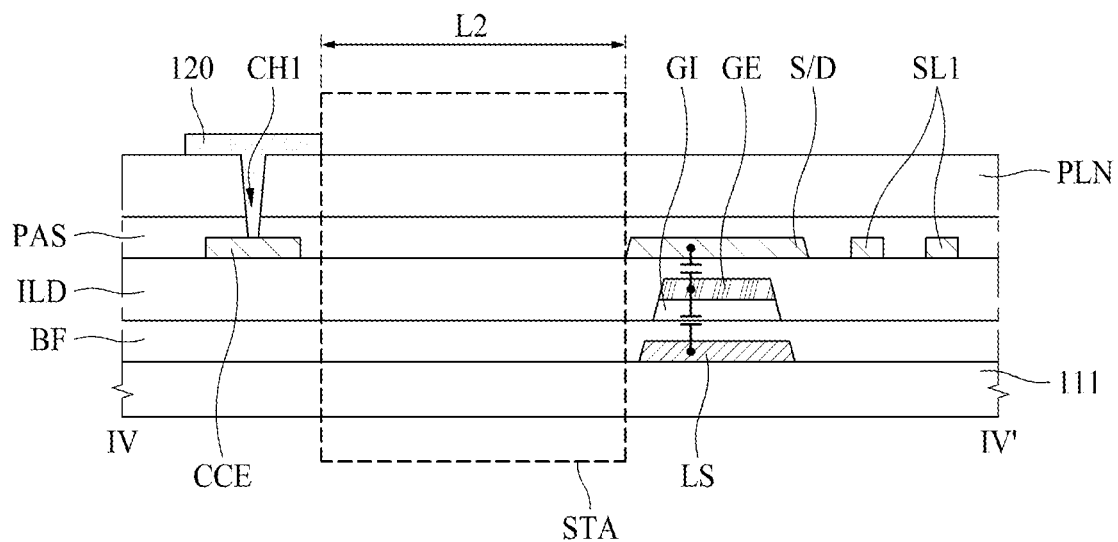
FIG. 5C is a cross-sectional view illustrating an example along IV-IV' of FIG. 5A.

FIG. 5A is a plan view illustrating the second embodiment of the pixel circuit and the sub-transmission area included in the area C of FIG. 3, FIG. 5B is a cross-sectional view illustrating an example along of FIG. 5A, and FIG. 5C is a cross-sectional view illustrating an example along IV-IV' of FIG. 5A.

Referring to FIGS. 5A to 5C in connection with FIGS. 1 to 3, each subpixel SP1, SP2, SP3, and SP4 of the transparent display panel 110 according to the second embodiment of the present disclosure may include a first divided electrode 121 and a second divided electrode 122 included in a light emitting element, and at least one thin film transistor DR_TFT, SW1_TFT, and SW2_TFT and a capacitor Cst included in each pixel circuit CA1, CA2, CA3, and CA4. Also, each of the subpixels SP1, SP2, SP3, and SP4 may include at least one first signal line SL1 extending in the first direction (or Y-axis direction). In addition, each of the subpixels SP1, SP2, SP3, and SP4 may include at least one second signal line SL2 extending in the second direction (or X-axis direction).

The transparent display panel 110 according to the second embodiment of the present disclosure shown in FIGS. 5A to 5C has substantially the same configurations as those of the transparent display panel 110 according to the first embodiment of the present disclosure shown in 4A to 4C except that the capacitor Cst disposed in a portion overlapped with a separation space between the first divided electrode 121 and the second divided electrode 122 has a narrow-width portion whose width is narrowed to one side of a width direction, whereby a detailed description for the same configurations may be omitted.

Referring to FIGS. 5A to 5C, the capacitor Cst of the transparent display panel 110 according to the second embodiment of the present disclosure may be disposed while being partially overlapped with the separation space between the first divided electrode 121 and the second divided electrode 122. The capacitor Cst may include the narrow-width portion whose width is narrowed to one side of the width direction of the capacitor Cst in the portion overlapped with the separation space between the first divided electrode 121 and the second divided electrode 122. For example, the capacitor Cst may be formed of three capacitor electrodes, and may include a first capacitor electrode Cst_LS provided in the same layer as a light shielding layer LS disposed over a substrate 111 and formed of the same material as the light shielding layer LS, a second capacitor electrode Cst_GE provided in the same layer as a gate electrode GE disposed over a buffer film BF and a gate insulating film GI and formed of the same material as the gate electrode GE, and a third capacitor electrode Cst_SD provided in the same layer as a source/drain electrode S/D disposed over an interlayer insulating film ILD and formed of the same material as the source/drain electrode S/D. The first capacitor electrode Cst_LS and the third capacitor electrode Cst_SD may be electrically connected to each other through a second contact hole CH2 penetrating the interlayer insulating film ILD and the buffer film BF, but not limited thereto. For example, the capacitor Cst may be formed of the two capacitor electrodes.

As shown in FIG. 5B, in case of the narrow-width portion of the capacitor Cst, a portion of the first capacitor electrode Cst_LS of the light shielding layer LS may be formed on one side of the width direction of the capacitor Cst in the portion overlapped with the separation space between the first divided electrode 121 and the second divided electrode 122, a portion of the second capacitor electrode Cst_GE of the gate electrode GE may be formed on one side of the width direction of the capacitor Cst, and a portion of the third capacitor electrode Cst_SD of the source/drain electrode S/D may be formed on one side of the width direction of the capacitor Cst. The narrow-width portion of the capacitor Cst may connect a first pixel circuit area overlapped with the first divided electrode 121 and a second pixel circuit area overlapped with the second divided electrode 122 to each other.

Referring to FIG. 5C, the transparent display panel 110 according to the second embodiment of the present disclosure may include the first electrode 120 disposed over a planarization film PLN over the substrate 111. The first electrode 120 may be electrically connected to the circuit connection electrode CCE through a first contact hole CH1 penetrating the planarization film PLN and a passivation film PAS. The first electrode 120 may include an opaque metal material.

The first electrode 120 is divided into the first divided electrode 121 and the second divided electrode 122 spaced apart from each other, and the divided first and second divided electrodes 121 and 122 may be arranged in parallel to each other with a separation space therebetween. The sub-transmission area STA may be disposed in the separation space between the first divided electrode 121 and the second divided electrode 122.

The sub-transmission area STA may be the area where an opaque (or non-transmissive) configuration is not disposed in the separation space between the first divided electrode 121 and the second divided electrode 122.

The sub-transmission area STA may be the area which excludes a portion overlapped with the narrow-width portion of the capacitor Cst and the first signal line SL1 in the separation space between the first divided electrode 121 and the second divided electrode 122.

The sub-transmission area STA may include a length L2 of the area excluding the portion overlapped with the narrow-width portion of the capacitor Cst and the first signal line SL1 in the separation space between the first divided electrode 121 and the second divided electrode 122. The length L2 of the area in the sub-transmission area STA may be longer than the length L1 of the area in the sub-transmission area STA according to the first embodiment shown in FIG. 4C. Thus, the sub-transmission area STA according to the second embodiment of the present disclosure may include an expanded area in comparison to the sub-transmission area STA according to the first embodiment of the present disclosure.

In the transparent display panel 110 according to the second embodiment of the present disclosure, the first electrode 120 included in the light emitting element is divided into the first divided electrode 121 and the second divided electrode 122 separated from each other, and the sub-transmission area capable of passing most of light incident from the outside, which is not overlapped with the narrow-width portion of the capacitor Cst of the pixel circuit CA1, CA2, CA3, and CA4 and the first signal line SL1, may be disposed in the separation space between the first divided electrode 121 and the second divided electrode 122. Accordingly, the transparent display panel 110 according to the second embodiment of the present disclosure may improve light transmittance through the sub-transmission area STA additionally provided in the transmission area TA.

Third Embodiment

Figure 6A:
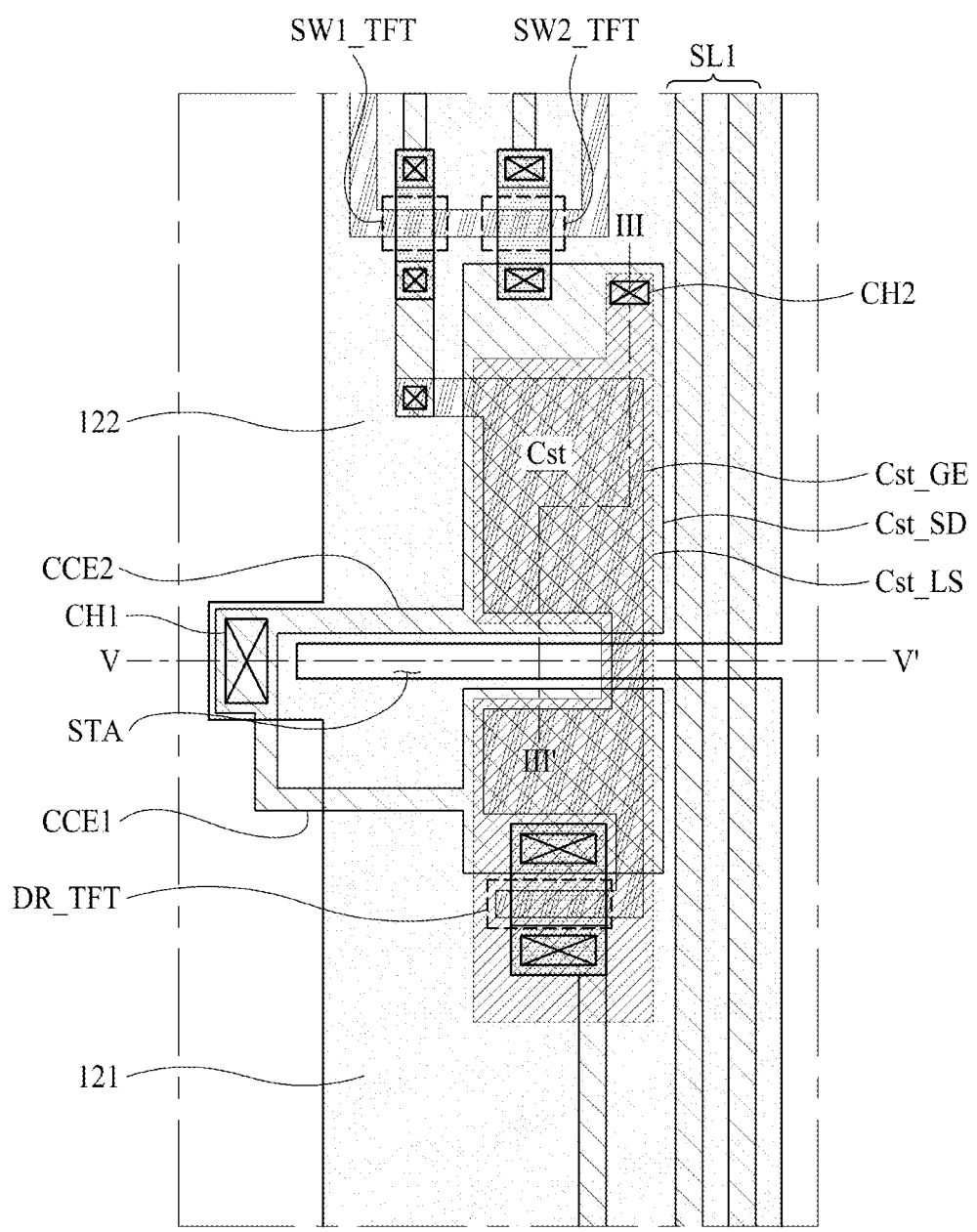
FIG. 6A is a plan view illustrating the third embodiment of a pixel circuit and a sub-transmission area included in the area C of FIG. 3.
Figure 6B:
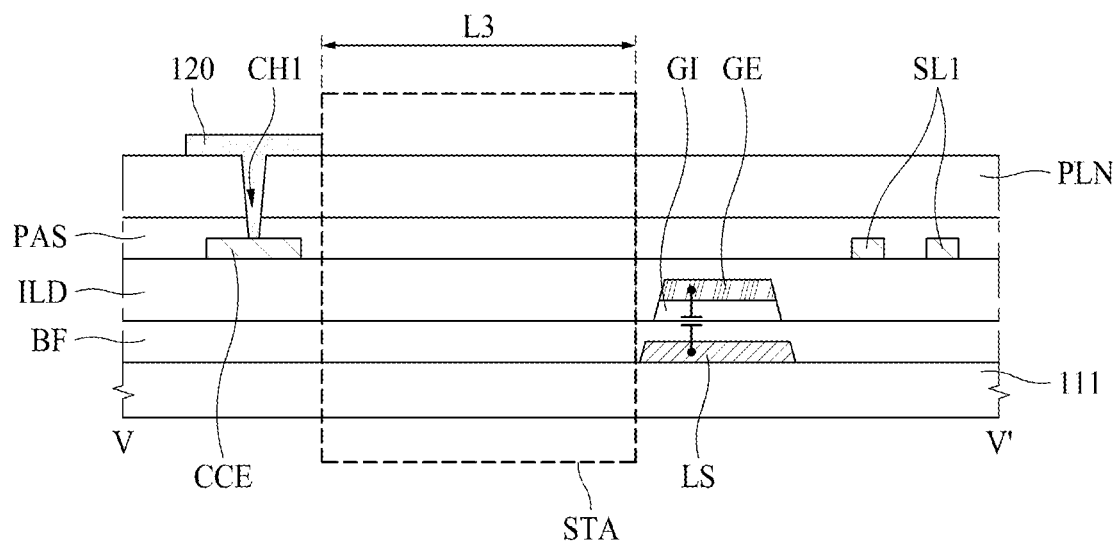
FIG. 6B is a cross-sectional view illustrating an example along V-V' of FIG. 6A.

FIG. 6A is a plan view illustrating the third embodiment of the pixel circuit and the sub-transmission area included in the area C of FIG. 3, and FIG. 6B is a cross-sectional view illustrating an example along V-V' of FIG. 6A. The cross-sectional view along in FIG. 6A is substantially the same as that of FIG. 5B, whereby a detailed description for the same configuration may be omitted.

Referring to FIGS. 6A and 6B in connection with FIGS. 1 to 3 and FIG. 5B, each subpixel SP1, SP2, SP3, and SP4 of the transparent display panel 110 according to the third embodiment of the present disclosure may include a first divided electrode 121 and a second divided electrode 122 included in a light emitting element, and at least one thin film transistor DR_TFT, SW1_TFT, and SW2_TFT and a capacitor Cst included in each pixel circuit CA1, CA2, CA3, and CA4. Also, each of the subpixels SP1, SP2, SP3, and SP4 may include at least one first signal line SL1 extending in the first direction (or Y-axis direction). In addition, each of the subpixels SP1, SP2, SP3, and SP4 may include at least one second signal line SL2 extending in the second direction (or X-axis direction).

The transparent display panel 110 according to the third embodiment of the present disclosure shown in FIGS. 6A and 6B has substantially the same configurations as those of the transparent display panel 110 according to the first embodiment of the present disclosure shown in FIGS. 4A to 4C and the transparent display panel 110 according to the second embodiment of the present disclosure shown in FIGS. 5A to 5C except that a circuit connection electrode CCE includes a first circuit connection electrode CCE1 connected with a first pixel circuit area and a second circuit connection electrode CCE2 connected with a second pixel circuit area, and a capacitor electrode is removed from the capacitor Cst disposed in a portion overlapped with a separation space between the first divided electrode 121 and the second divided electrode 122, whereby a detailed description for the same configuration may be omitted.

Referring to FIGS. 6A and 6B, the transparent display panel 110 according to the third embodiment of the present disclosure may include the first circuit connection electrode CCE1 and the second circuit connection electrode CCE2 for electrically connecting the pixel circuit CA1, CA2, CA3, and CA4 and the first electrode 120 to each other.

With respect to the separation space between the first divided electrode 121 and the second divided electrode 122, the first circuit connection electrode CCE1 may electrically connect the first electrode 120 with the first pixel circuit area overlapped with the first divided electrode 121. The first circuit connection electrode CCE1 may extend from first or second source/drain electrode S/D of the driving thin film transistor DR_TFT disposed in the first pixel circuit area and may be overlapped with a circuit contact portion CCT of the first electrode 120. The first circuit connection electrode CCE1 may be electrically connected to the circuit contact portion CCT through a first contact hole CH1.

With respect to the separation space between the first divided electrode 121 and the second divided electrode 122, the second circuit connection electrode CCE2 may electrically connect the first electrode 120 with the second pixel circuit area overlapped with the second divided electrode 122. The second circuit connection electrode CCE2 may extend from first or second source/drain electrode S/D of the second switching thin film transistor SW2_TFT disposed in the second pixel circuit area and may be overlapped with the circuit contact portion CCT of the first electrode 120. The second circuit connection electrode CCE2 may be electrically connected to a third capacitor electrode formed of the source/drain electrode S/D of the capacitor Cst. The second circuit connection electrode CCE2 may be electrically connected to the circuit contact portion CCT through the first contact hole CH1.

The capacitor Cst of the transparent display panel 110 according to the third embodiment of the present disclosure may be disposed while being partially overlapped with the separation space between the first divided electrode 121 and the second divided electrode 122. The capacitor Cst may include the narrow-width portion whose width is narrowed to one side of the width direction of the capacitor Cst at the portion overlapped with the separation space between the first divided electrode 121 and the second divided electrode 122. For example, the capacitor Cst may be formed of three capacitor electrodes, and may include a first capacitor electrode Cst_LS provided in the same layer as a light shielding layer LS disposed over the substrate 111 and formed of the same material as the light shielding layer LS, a second capacitor electrode Cst_GE provided in the same layer as a gate electrode GE disposed on a buffer film BF and a gate insulating film GI and formed of the same material as the gate electrode GE, and a third capacitor electrode Cst_SD provided in the same layer as a source/drain electrode S/D disposed over an interlayer insulating film ILD and formed of the same material as the source/drain electrode S/D. The first capacitor electrode Cst_LS and the third capacitor electrode Cst_SD may be electrically connected to each other through a second contact hole CH2 penetrating the interlayer insulating film ILD and the buffer film BF, but not limited thereto. For example, the capacitor Cst may be formed of the two capacitor electrodes.

As shown in FIG. 6B, in case of the narrow-width portion of the capacitor Cst, a portion of the first capacitor electrode Cst_LS of the light shielding layer LS may be formed on one side of the width direction of the capacitor Cst in the portion overlapped with the separation space between the first divided electrode 121 and the second divided electrode 122, a portion of the second capacitor electrode Cst_GE of the gate electrode GE may be formed on one side of the width direction of the capacitor Cst, and the third capacitor electrode Cst_SD of the source/drain electrode S/D may be disconnectedly provided. The third capacitor electrode Cst_SD of the capacitor Cst disconnectedly provided in the separation space between the first divided electrode 121 and the second divided electrode 122 may be connected through the first circuit connection electrode CCE1 and the second circuit connection electrode CCE2. The narrow-width portion of the capacitor Cst may connect a first pixel circuit area overlapped with the first divided electrode 121 and a second pixel circuit area overlapped with the second divided electrode 122 to each other.

Referring to FIG. 6B, the transparent display panel 110 according to the third embodiment of the present disclosure may include the first electrode 120 disposed over a planarization film PLN over the substrate 111. The first electrode 120 may be electrically connected to the circuit connection electrode CCE through a first contact hole CH1 penetrating the planarization film PLN and a passivation film PAS. The first electrode 120 may include an opaque metal material.

The first electrode 120 is divided into the first divided electrode 121 and the second divided electrode 122 spaced apart from each other, and the divided first and second divided electrodes 121 and 122 may be arranged in parallel to each other with a separation space therebetween. The sub-transmission area STA may be disposed in the separation space between the first divided electrode 121 and the second divided electrode 122.

The sub-transmission area STA may be the area where an opaque (or non-transmissive) configuration is not disposed in the separation space between the first divided electrode 121 and the second divided electrode 122.

The sub-transmission area STA may be the area which excludes a portion overlapped with the narrow-width portion of the capacitor Cst and the first signal line SL1 in the separation space between the first divided electrode 121 and the second divided electrode 122. The narrow-width portion of the capacitor Cst includes the first capacitor electrode Cst_LS of the light shielding layer LS, and the second capacitor electrode Cst_GE of the gate electrode GE, and the third capacitor electrode Cst_SD of the source/drain electrode S/D may be removed to have a narrow width.

The sub-transmission area STA may include a length L3 of the area excluding the portion overlapped with the first signal line SL1 and the narrow-width portion of the capacitor Cst from which the third capacitor electrode Cst_SD of the source/drain electrode S/D is removed in the separation space between the first divided electrode 121 and the second divided electrode 122. The length L3 of the sub-transmission area STA according to the third embodiment may be longer than the length L1 of the sub-transmission area STA according to the first embodiment shown in FIG. 4C and the length L2 of the sub-transmission area STA according to the second embodiment shown in FIG. 5C. Thus, the sub-transmission area STA according to the third embodiment of the present disclosure may include an expanded area in comparison to the sub-transmission area STA according to the first embodiment of the present disclosure and the sub-transmission area STA according to the second embodiment of the present disclosure.

In the transparent display panel 110 according to the third embodiment of the present disclosure, the first electrode 120 included in the light emitting element is divided into the first divided electrode 121 and the second divided electrode 122 separated from each other, and the sub-transmission area capable of passing most of light incident from the outside, which is not overlapped with the narrow-width portion of the capacitor Cst of the pixel circuit CA1, CA2, CA3, and CA4 and the first signal line SL1, may be disposed in the separation space between the first divided electrode 121 and the second divided electrode 122. Accordingly, the transparent display panel 110 according to the third embodiment of the present disclosure may improve light transmittance by expanding the sub-transmission area STA additionally provided in the transmission area TA.

Fourth Embodiment

Figure 7A:
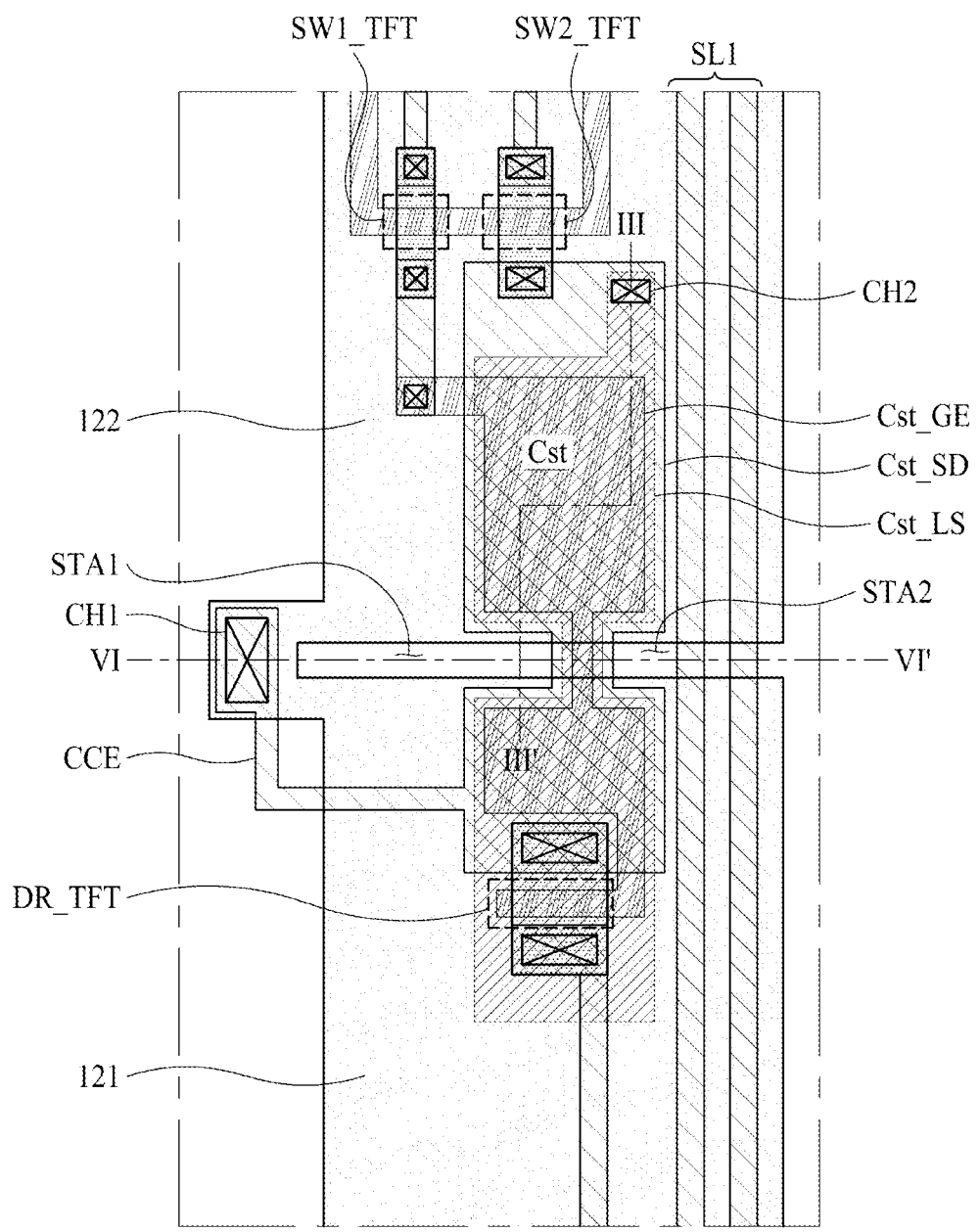
FIG. 7A is a plan view illustrating the fourth embodiment of a pixel circuit and a sub-transmission area included in the area C of FIG. 3.
Figure 7B:
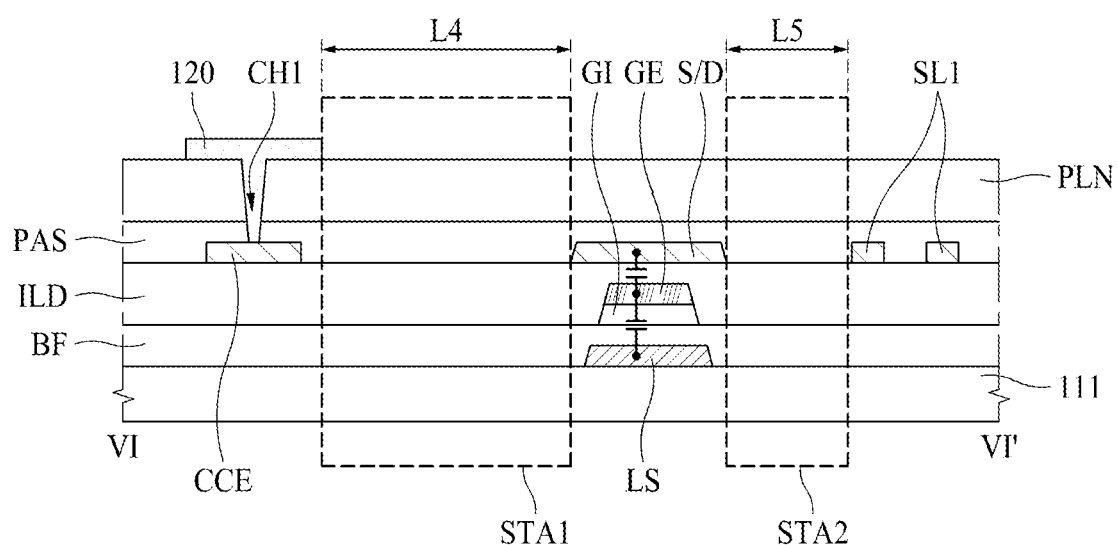
FIG. 7B is a cross-sectional view illustrating an example along VI-VI' of FIG. 7A.

FIG. 7A is a plan view illustrating the fourth embodiment of the pixel circuit and the sub-transmission area included in the area C of FIG. 3, and FIG. 7B is a cross-sectional view illustrating an example along VI-VI' of FIG. 7A. The cross-sectional view along in FIG. 7A is substantially the same as that of FIG. 5B, whereby a detailed description for the same configuration may be omitted.

The transparent display panel 110 according to the fourth embodiment of the present disclosure shown in FIGS. 7A and 7B has substantially the same configurations as those of the transparent display panel 110 according to the first embodiment of the present disclosure shown in FIGS. 4A to 4C, the transparent display panel 110 according to the second embodiment of the present disclosure shown in FIGS. 5A to 5C, or the transparent display panel 110 according to the third embodiment of the present disclosure shown in FIGS. 6A and 6B except that a capacitor Cst disposed in a portion overlapped with a separation space between a first divided electrode 121 and a second divided electrode 122 has a narrow-width portion whose width is narrowed to the center of a width direction, whereby a detailed description for the same configurations may be omitted.

Referring to FIGS. 7A and 7B, the capacitor Cst of the transparent display panel 110 according to the fourth embodiment of the present disclosure may be disposed while being partially overlapped with the separation space between the first divided electrode 121 and the second divided electrode 122. The capacitor Cst may include the narrow-width portion whose width is narrowed to the center of the width direction of the capacitor Cst in the portion overlapped with the separation space between the first divided electrode 121 and the second divided electrode 122.

As shown in FIG. 7B, in case of the narrow-width portion of the capacitor Cst, a portion of a first capacitor electrode Cst_LS of a light shielding layer LS may be formed on the center of the width direction of the capacitor Cst in the portion overlapped with the separation space between the first divided electrode 121 and the second divided electrode 122, a portion of a second capacitor electrode Cst_GE of a gate electrode GE may be formed on the center of the width direction of the capacitor Cst, and a portion of a third capacitor electrode Cst_SD of a source/drain electrode S/D may be formed on the center of the width direction of the capacitor Cst. The narrow-width portion of the capacitor Cst may connect a first pixel circuit area overlapped with the first divided electrode 121 and a second pixel circuit area overlapped with the second divided electrode 122 to each other.

A first sub-transmission area STA1 and a second sub-transmission area STA2 may be disposed in the separation space between the first divided electrode 121 and the second divided electrode 122.

The first sub-transmission area STA1 and the second sub-transmission area STA2 may be the area where an opaque (or non-transmissive) configuration is not arranged in the separation space between the first divided electrode 121 and the second divided electrode 122.

The first sub-transmission area STA1 and the second sub-transmission area STA2 may be the area which excludes the portion overlapped with the narrow-width portion of the capacitor Cst and the first signal line SL1 in the separation space between the first divided electrode 121 and the second divided electrode 122.

The first sub-transmission area STA1 may be disposed between the circuit contact portion CCT of the first electrode 120 and the narrow-width portion of the capacitor Cst in the separation space between the first divided electrode 121 and the second divided electrode 122. The first sub-transmission area STA1 may include a length L4 of the area between the circuit contact portion CCT of the first electrode 120 and the narrow-width portion of the capacitor Cst.

The second sub-transmission area STA2 may be disposed between the narrow-width portion of the capacitor Cst and the first signal line SL1 in the separation space between the first divided electrode 121 and the second divided electrode 122. The second sub-transmission area STA2 may include a length L5 of the area between the narrow-width portion of the capacitor Cst and the first signal line SL1.

The first sub-transmission area STA1 and the second sub-transmission area STA2 may be separately disposed in the separation space between the first divided electrode 121 and the second divided electrode 122. Accordingly, the first sub-transmission area STA1 and the second sub-transmission area STA2 according to the fourth embodiment of the present disclosure may include an expanded area in comparison to the sub-transmission area STA according to the first to third embodiments of the present disclosure.

In the transparent display panel 110 according to the fourth embodiment of the present disclosure, the first electrode 120 included in the light emitting element is divided into the first divided electrode 121 and the second divided electrode 122 separated from each other, and the first and second sub-transmission areas capable of passing most of light incident from the outside, which are not overlapped with the narrow-width portion of the capacitor Cst of the pixel circuit CA1, CA2, CA3, and CA4 and the first signal line SL1, may be disposed in the separation space between the first divided electrode 121 and the second divided electrode 122. Accordingly, the transparent display panel 110 according to the fourth embodiment of the present disclosure may improve light transmittance by expanding the sub-transmission area STA additionally provided in the transmission area TA.

Fifth Embodiment

Figure 8A:
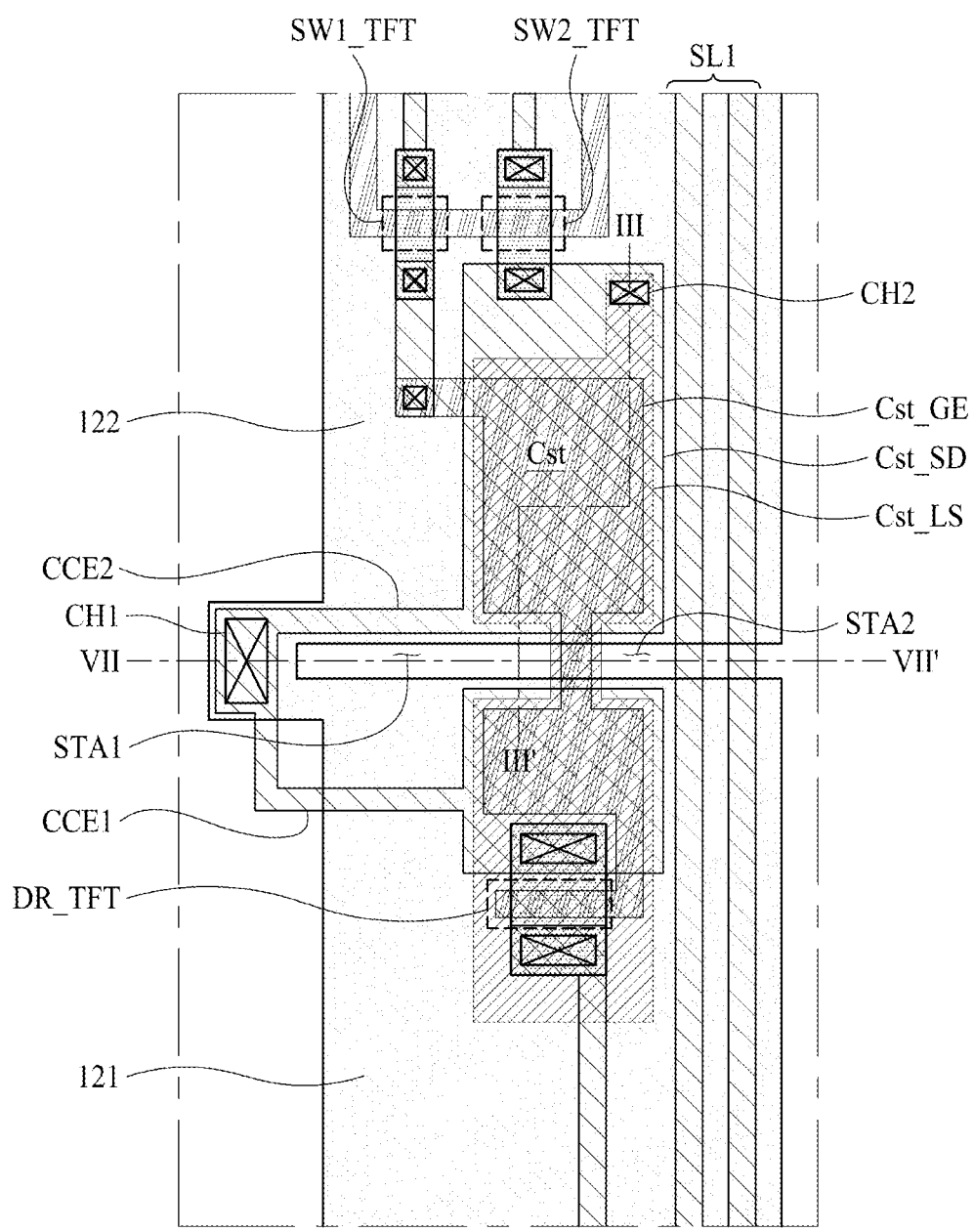
FIG. 8A is a plan view illustrating the fifth embodiment of a pixel circuit and a sub-transmission area included in the area C of FIG. 3.
Figure 8B:
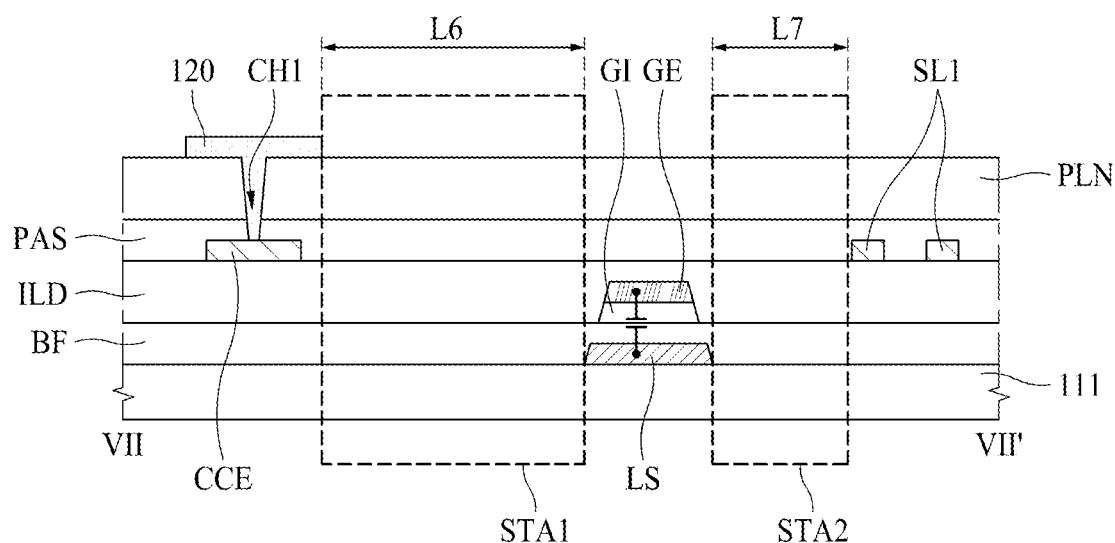
FIG. 8B is a cross-sectional view illustrating an example along VII-VII' of FIG. 8A.

FIG. 8A is a plan view illustrating the fifth embodiment of the pixel circuit and the sub-transmission area included in the area C of FIG. 3, and FIG. 8B is a cross-sectional view illustrating an example along VII-VII' of FIG. 8A. The cross-sectional view along in FIG. 8A is substantially the same as that of FIG. 5B, whereby a detailed description for the same configuration may be omitted.

The transparent display panel 110 according to the fifth embodiment of the present disclosure shown in FIGS. 8A and 8B has substantially the same configurations as those of the transparent display panel 110 according to the first embodiment of the present disclosure shown in FIGS. 4A to 4C, the transparent display panel 110 according to the second embodiment of the present disclosure shown in FIGS. 5A to 5C, the transparent display panel 110 according to the third embodiment of the present disclosure shown in FIGS. 6A and 6B, or the transparent display panel 110 according to the fourth embodiment of the present disclosure shown in FIGS. 7A and 7B except that a circuit connection electrode CCE includes a first circuit connection electrode CCE1 connected with a first pixel circuit area and a second circuit connection electrode CCE2 connected with a second pixel circuit area, and a capacitor Cst disposed in a portion overlapped with a separation space between a first divided electrode 121 and a second divided electrode 122 has a narrow-width portion whose width is narrowed to the center of a width direction and formed by removing some of capacitor electrodes, whereby a detailed description for the same configuration may be omitted.

Referring to FIGS. 8A and 8B, the transparent display panel 110 according to the fifth embodiment of the present disclosure may include the first circuit connection electrode CCE1 and the second circuit connection electrode CCE2 for electrically connecting the pixel circuit CA1, CA2, CA3, and CA4 and the first electrode 120 to each other.

The capacitor Cst of the transparent display panel 110 according to the fifth embodiment of the present disclosure may be disposed while being partially overlapped with the separation space between the first divided electrode 121 and the second divided electrode 122. The capacitor Cst may include the narrow-width portion whose width is narrowed to the center of the width direction of the capacitor Cst in the portion overlapped with the separation space between the first divided electrode 121 and the second divided electrode 122.

As shown in FIG. 8B, in case of the narrow-width portion of the capacitor Cst, a portion of a first capacitor electrode Cst_LS of a light shielding layer LS may be formed on the center of the width direction of the capacitor Cst in the portion overlapped with the separation space between the first divided electrode 121 and the second divided electrode 122, a portion of a second capacitor electrode Cst_GE of a gate electrode GE may be formed on the center of the width direction of the capacitor Cst, and a portion of a third capacitor electrode Cst_SD of a source/drain electrode S/D may be formed disconnectedly. The third capacitor electrode Cst_SD of the capacitor Cst disconnected in the separation space between the first divided electrode 121 and the second divided electrode 122 may be connected through the first circuit connection electrode CCE1 and the second circuit connection electrode CCE2. The narrow-width portion of the capacitor Cst may connect a first pixel circuit area overlapped with the first divided electrode 121 and a second pixel circuit area overlapped with the second divided electrode 122 to each other.

A first sub-transmission area STA1 and a second sub-transmission area STA2 may be disposed in the separation space between the first divided electrode 121 and the second divided electrode 122.

The first sub-transmission area STA1 and the second sub-transmission area STA2 may be the area where an opaque (or non-transmissive) configuration is not arranged in the separation space between the first divided electrode 121 and the second divided electrode 122.

The first sub-transmission area STA1 and the second sub-transmission area STA2 may be the area which excludes the portion overlapped with the narrow-width portion of the capacitor Cst and the first signal line SL1 in the separation space between the first divided electrode 121 and the second divided electrode 122. The narrow-width portion of the capacitor Cst includes the first capacitor electrode Cst_LS of the light shielding layer LS, and the second capacitor electrode Cst_GE of the gate electrode GE, and the third capacitor electrode Cst_SD of the source/drain electrode S/D may be removed to have a narrow width.

The first sub-transmission area STA1 may be disposed between the circuit contact portion CCT of the first electrode 120 and the narrow-width portion of the capacitor Cst in the separation space between the first divided electrode 121 and the second divided electrode 122. The first sub-transmission area STA1 may include a length L6 of the area between the circuit contact portion CCT of the first electrode 120 and the narrow-width portion of the capacitor Cst.

The second sub-transmission area STA2 may be disposed between the narrow-width portion of the capacitor Cst and the first signal line SL1 in the separation space between the first divided electrode 121 and the second divided electrode 122. The second sub-transmission area STA2 may include a length L7 of the area between the narrow-width portion of the capacitor Cst and the first signal line SL1.

The length L6 of the first sub-transmission area STA1 and the length L7 of the second sub-transmission area STA2 may be respectively longer than the length L4 of the first sub-transmission area STA1 and the length L5 of the second sub-transmission area STA2 according to the fourth embodiment shown in FIG. 7B. Thus, the first sub-transmission area STA1 and the second sub-transmission area STA2 according to the fifth embodiment of the present disclosure may include an expanded area in comparison to the first sub-transmission area STA1 and the second sub-transmission area STA2 according to the fourth embodiment of the present disclosure.

In the transparent display panel 110 according to the fifth embodiment of the present disclosure, the first electrode 120 included in the light emitting element is divided into the first divided electrode 121 and the second divided electrode 122 separated from each other, and the first and second sub-transmission areas capable of passing most of light incident from the outside, which are not overlapped with the narrow-width portion of the capacitor Cst of the pixel circuit CA1, CA2, CA3, and CA4 and the first signal line SL1, may be separately disposed in the separation space between the first divided electrode 121 and the second divided electrode 122. Accordingly, the transparent display panel 110 according to the fifth embodiment of the present disclosure may improve light transmittance by expanding the sub-transmission area STA additionally provided in the transmission area TA.

Sixth Embodiment

Figure 9A:
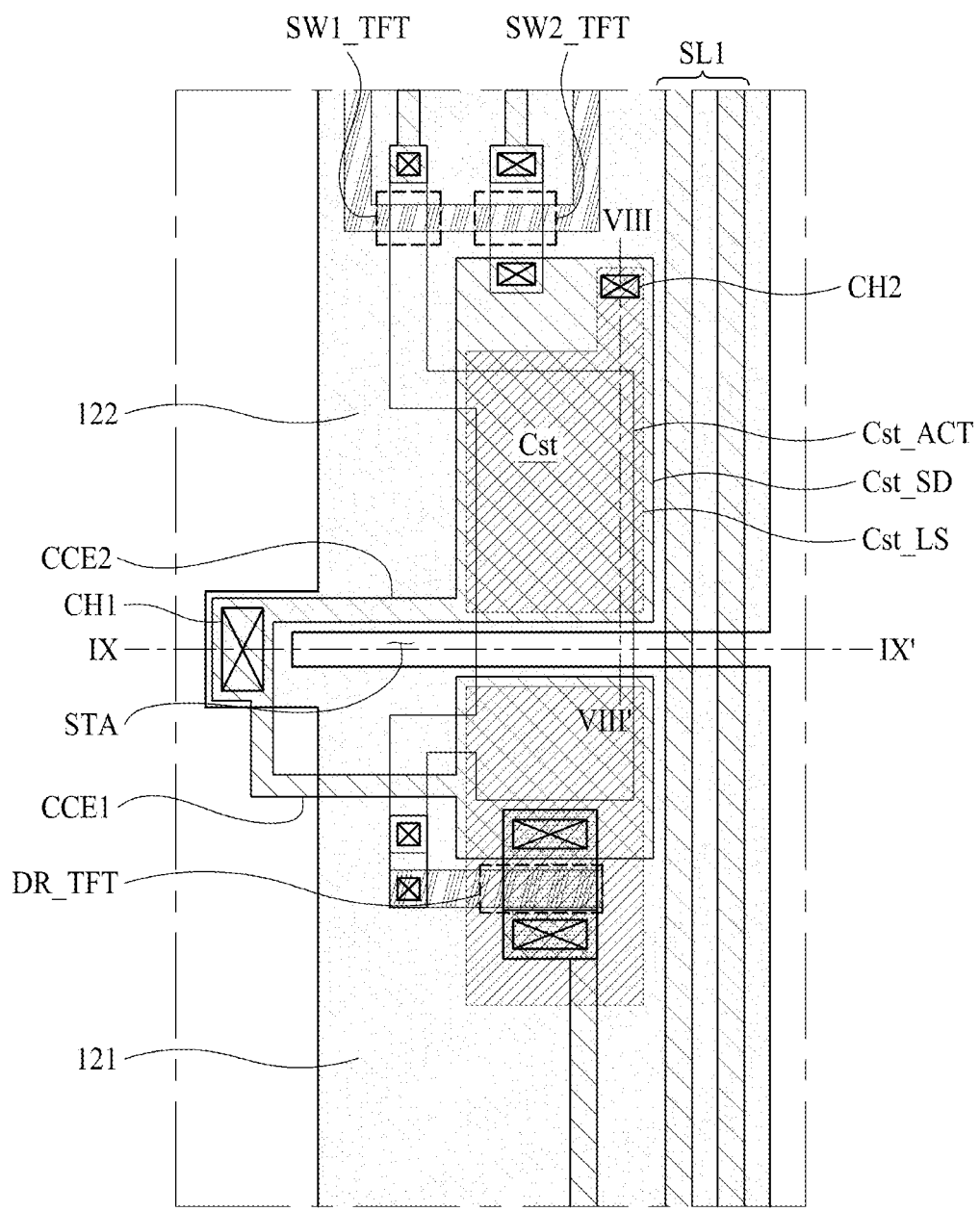
FIG. 9A is a plan view illustrating the sixth embodiment of a pixel circuit and a sub-transmission area included in the area C of FIG. 3.
Figure 9B:
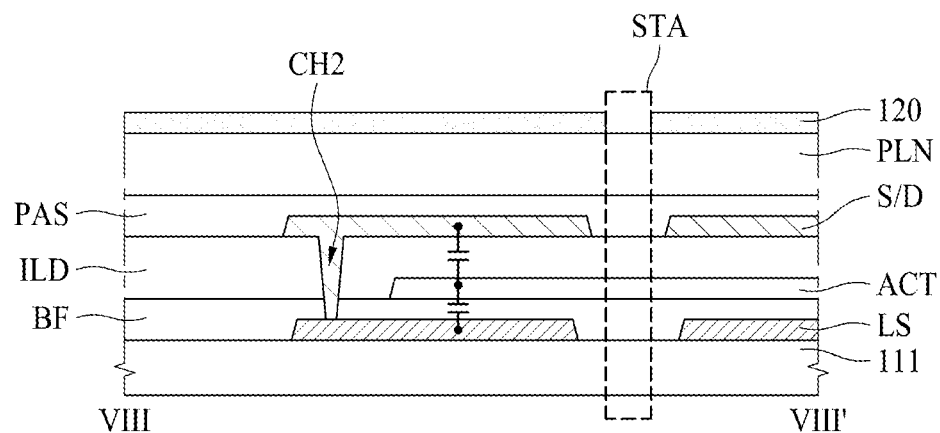
FIG. 9B is a cross-sectional view illustrating an example along VIII-VIII' of FIG. 9A.
Figure 9C:
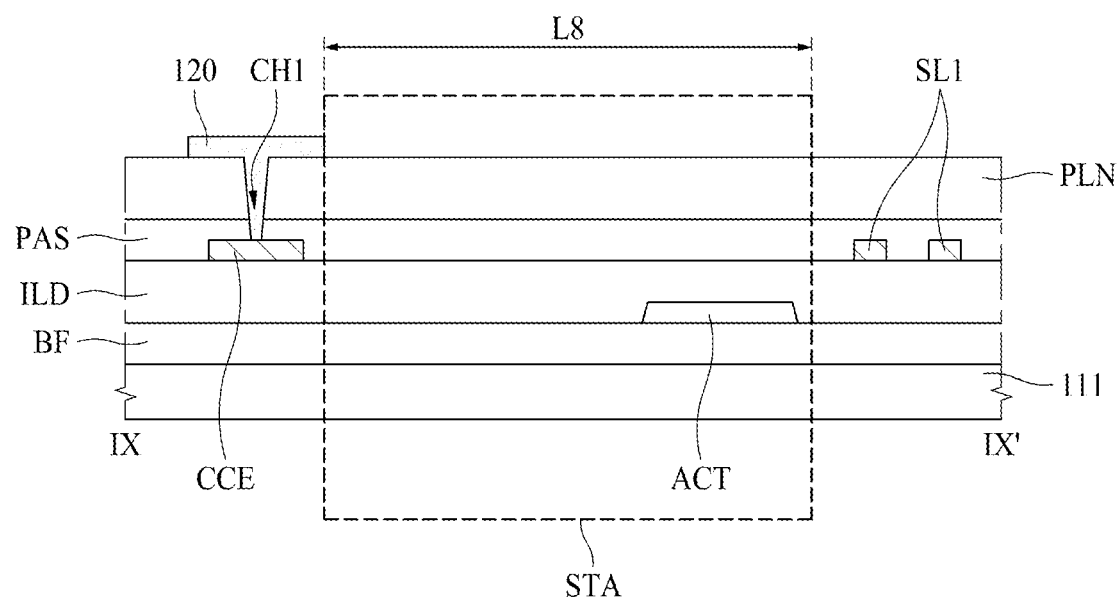
FIG. 9C is a cross-sectional view illustrating an example along IX-IX' of FIG. 9A.

FIG. 9A is a plan view illustrating the sixth embodiment of the pixel circuit and the sub-transmission area included in the area C of FIG. 3, FIG. 9B is a cross-sectional view illustrating an example along VIII-VIII' of FIG. 9A, and FIG. 9C is a cross-sectional view illustrating an example along IX-IX' of FIG. 9A.

The transparent display panel 110 according to the sixth embodiment of the present disclosure shown in FIGS. 9A to 9C has substantially the same configurations as those of the transparent display panel 110 according to the first embodiment of the present disclosure shown in FIGS. 4A to 4C, the transparent display panel 110 according to the second embodiment of the present disclosure shown in FIGS. 5A to 5C, the transparent display panel 110 according to the third embodiment of the present disclosure shown in FIGS. 6A and 6B, the transparent display panel 110 according to the fourth embodiment of the present disclosure shown in FIGS. 7A and 7B, or the transparent display panel 110 according to the fifth embodiment of the present disclosure shown in FIGS. 8A and 8B except that a circuit connection electrode CCE includes a first circuit connection electrode CCE1 connected with a first pixel circuit area and a second circuit connection electrode CCE2 connected with a second pixel circuit area, and a capacitor Cst disposed in a portion overlapped with a separation space between a first divided electrode 121 and a second divided electrode 122 is formed of a transparent conductive layer, whereby a detailed description for the same configuration may be omitted.

Referring to FIGS. 9A to 9C, the transparent display panel 110 according to the sixth embodiment of the present disclosure may include the first circuit connection electrode CCE1 and the second circuit connection electrode CCE2 for electrically connecting the pixel circuit CA1, CA2, CA3, and CA4 and the first electrode 120.

The capacitor Cst of the transparent display panel 110 according to the sixth embodiment of the present disclosure may be disposed while being partially overlapped with the separation space between the first divided electrode 121 and the second divided electrode 122. The capacitor Cst may include the transparent conductive layer in the portion overlapped with the separation space between the first divided electrode 121 and the second divided electrode 122.

The transparent conductive layer of the capacitor Cst may include a conductive active layer ACT. In case of the capacitor Cst, a first capacitor electrode Cst_LS of a light shielding layer LS and a third capacitor electrode Cst_SD of a source/drain electrode S/D may be formed disconnectedly in the portion overlapped with the separation space between the first divided electrode 121 and the second divided electrode 122, and only second capacitor electrode Cast_ACT of the conductive active layer ACT corresponding to the transparent conductive layer may be disposed in the portion overlapped with the separation space between the first divided electrode 121 and the second divided electrode 122. The third capacitor electrode Cst_SD of the capacitor Cst disconnected in the separation space between the first divided electrode 121 and the second divided electrode 122 may be connected through the first circuit connection electrode CCE1 and the second circuit connection electrode CCE2. The transparent conductive layer of the capacitor Cst may connect a first pixel circuit area overlapped with the first divided electrode 121 and a second pixel circuit area overlapped with the second divided electrode 122 to each other.

The sub-transmission area STA may be disposed in the separation space between the first divided electrode 121 and the second divided electrode 122.

The sub-transmission area STA may be the area where an opaque (or non-transmissive) configuration is not disposed in the separation space between the first divided electrode 121 and the second divided electrode 122.

The sub-transmission area STA may be the area which excludes the portion overlapped with the first signal line SL1 in the separation space between the first divided electrode 121 and the second divided electrode 122. The sub-transmission area STA may include a portion overlapped with the transparent conductive layer of the capacitor Cst in the separation space between the first divided electrode 121 and the second divided electrode 122.

In case of the capacitor Cst disposed in the separation space between the first divided electrode 121 and the second divided electrode 122, the first capacitor electrode Cst_LS of the light shielding layer LS and the third capacitor electrode Cst_SD of the source/drain electrode S/D are removed therefrom, and only the second capacitor electrode Cst_ACT of the active layer ACT corresponding to the transparent conductive layer may be disposed therein.

The sub-transmission area STA may include a length L8 of the area excluding the portion overlapped with the first signal line SL1 in the separation space between the first divided electrode 121 and the second divided electrode 122. The length L8 of the area in the sub-transmission area STA may be longer than the length L1 of the area in the sub-transmission area STA according to the first embodiment shown in FIG. 4C, the length L2 of the area in the sub-transmission area STA according to the second embodiment shown in FIG. 5C, the length L3 of the area in the sub-transmission area STA according to the third embodiment shown in FIG. 6B, the length L4 and the length L5 of the areas in the respective first and second the sub-transmission areas STA1 and STA2 according to the fourth embodiment shown in FIG. 7B, and the length L6 and the length L7 of the areas in the respective first and second the sub-transmission areas STA1 and STA2 according to the fifth embodiment shown in FIG. 8B. Thus, the sub-transmission area STA according to the sixth embodiment of the present disclosure may include an expanded area in comparison to the sub-transmission areas STA according to the first to fifth embodiments of the present disclosure.

In the transparent display panel 110 according to the sixth embodiment of the present disclosure, the first electrode 120 included in the light emitting element is divided into the first divided electrode 121 and the second divided electrode 122 separated from each other, and the sub-transmission area capable of passing most of light incident from the outside, which is not overlapped with the first signal line SL and is disposed in the separation space between the first divided electrode 121 and the second divided electrode 122, may be disposed widely. Accordingly, the transparent display panel 110 according to the sixth embodiment of the present disclosure may improve light transmittance by expanding the sub-transmission area STA additionally provided in the transmission area TA.

According to the embodiments of the present disclosure, the transparent display device is prepared with the division structure of the subpixel, and the sub-transmission area is provided between each of the divided subpixels so that it is possible to reduce dark-pointed portions in the light emitting area by the repairing process, and to improve light transmittance by the sub-transmission area.

According to the embodiments of the present disclosure, the transparent display device is prepared with the division structure of the subpixel, and the capacitor area overlapped with the separation space between the divided subpixels is minimized so that it is possible to secure the expanded sub-transmission area, and to improve light transmittance by the additionally provided sub-transmission area.

It will be apparent to those skilled in the art that the present disclosure described above is not limited by the above-described embodiments and the accompanying drawings and that various substitutions, modifications, and variations can be made in the present disclosure without departing from the spirit or scope of the disclosures. It is intended that all variations or modifications derived from the meaning, scope, and equivalent concept of the claims fall within the scope of the present disclosure.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A transparent display device, comprising:
a plurality of transmission areas; and
a plurality of subpixels, wherein a subpixel of the plurality of subpixels is disposed between each of the plurality of transmission areas, and is configured to include a pixel circuit and a light emitting element having a first electrode connected to the pixel circuit,
wherein the first electrode in the subpixel includes a first divided electrode and a second divided electrode separated from each other, and includes a sub-transmission area disposed between the first divided electrode and the second divided electrode.

2. The transparent display device according to claim 1, wherein at least a portion of the pixel circuit is overlapped with the first electrode, and
the sub-transmission area is disposed in a portion which is not overlapped with the pixel circuit.

3. The transparent display device according to claim 1, wherein the subpixel includes at least one signal line connected to the pixel circuit, and
the sub-transmission area is disposed in a portion which is not overlapped with the at least one signal line.

4. The transparent display device according to claim 1, wherein the first electrode includes an opaque metal material, and
the pixel circuit includes at least one metal pattern layer of an opaque metal material.

5. The transparent display device according to claim 1, wherein the pixel circuit further includes a transparent conductive layer which is partially overlapped with the first electrode, and
the sub-transmission area is disposed in a portion overlapped with the transparent conductive layer.

6. The transparent display device according to claim 1, further comprising a capacitor made of a portion of the pixel circuit and disposed between the first divided electrode and the second divided electrode.

7. The transparent display device according to claim 1, further comprising a capacitor made of a portion of the pixel circuit, configured to have a narrow width in a portion overlapped with a separation space between the first divided electrode and the second divided electrode, and disposed between the first divided electrode and the second divided electrode.

8. The transparent display device according to claim 1, wherein the first divided electrode and the second divided electrode of the first electrode are spaced apart from each other with the separation space therebetween and are disposed in parallel to each other, and
the sub-transmission area is disposed in the separation space between the first divided electrode and the second divided electrode.

9. The transparent display device according to claim 8,
wherein at least a portion of the pixel circuit is overlapped with the separation space between the first divided electrode and the second divided electrode, and
the sub-transmission area corresponds to the area which excludes a portion overlapped with the pixel circuit in the separation space between the first divided electrode and the second divided electrode.

10. The transparent display device according to claim 9, wherein the pixel circuit includes a narrow-width portion whose width is narrowed in the portion overlapped with the separation space between the first divided electrode and the second divided electrode, and
the sub-transmission area corresponds to the area which excludes a portion overlapped with the narrow-width portion of the pixel circuit in the separation space between the first divided electrode and the second divided electrode.

11. The transparent display device according to claim 10, wherein the narrow-width portion of the pixel circuit is disposed in one side or the other side of a width direction or is disposed in the center of the width direction of the pixel circuit.

12. The transparent display device according to claim 8, wherein each of the plurality of subpixels further includes at least one signal line connected with the pixel circuit,
the at least one signal line extends to be perpendicular to the separation space between the first divided electrode and the second divided electrode, and
the sub-transmission area corresponds to the area which excludes a portion overlapped with the at least one signal line in the separation space between the first divided electrode and the second divided electrode.

13. The transparent display device according to claim 8, wherein the pixel circuit further includes a transparent conductive layer partially overlapped with the separation space between the first divided electrode and the second divided electrode, and
the sub-transmission area includes a portion overlapped with the transparent conductive layer in the separation space between the first divided electrode and the second divided electrode.

14. The transparent display device according to claim 13, wherein the transparent conductive layer includes a conductive active layer.

15. The transparent display device according to claim 1, further comprising:
a first anode connection portion extending from the first divided electrode to a direction of the transmission area;
a second anode connection portion extending from the second divided electrode to the direction of the transmission area; and
a circuit contact portion configured to connect the first anode connection portion and the second anode connection portion to each other, and electrically connected to the pixel circuit through a circuit connection electrode extending from the pixel circuit,
wherein the circuit connection electrode is not overlapped with a separation space between the first divided electrode and the second divided electrode.

16. The transparent display device according to claim 15, wherein the pixel circuit includes:
a driving thin film transistor comprising an active layer, a gate electrode, a first source/drain electrode and a second source/drain electrode; and
a capacitor connected with the first electrode and the gate electrode of the driving thin film transistor and partially overlapped with the separation space between the first divided electrode and the second divided electrode,
wherein the circuit connection electrode is extending from the first or second source/drain electrode of the driving thin film transistor and is connected to the circuit contact portion through a first contact hole.

17. The transparent display device according to claim 16, wherein the capacitor includes a narrow-width portion whose width is narrowed in a portion overlapped with the separation space between the first divided electrode and the second divided electrode,
the narrow-width portion of the capacitor is disposed in one side or the other side of a width direction of the capacitor or is disposed in the center of the width direction of the capacitor, and
the sub-transmission area corresponds to the area which excludes a portion overlapped with the narrow-width portion of the capacitor in the separation space between the first divided electrode and the second divided electrode.

18. The transparent display device according to claim 16, wherein the pixel circuit includes:
a first pixel circuit area configured to include the driving thin film transistor and overlapped with the first divided electrode; and
a second pixel circuit area overlapped with the second divided electrode,
wherein the capacitor is disposed between the first pixel circuit area and the second pixel circuit area.

19. The transparent display device according to claim 18, wherein the pixel circuit further includes at least one switching thin film transistor, and the at least one switching thin film transistor is disposed in the second pixel circuit area.

20. The transparent display device according to claim 19, wherein the circuit connection electrode includes:
a first circuit connection electrode connected to the first or second source/drain electrode of the driving thin film transistor of the first pixel circuit area; and
a second circuit connection electrode connected to the first or second source/drain electrode of the at least one switching thin film transistor of the second pixel circuit area,
wherein the first and second source/drain electrodes of the driving thin film transistor and the first and second source/drain electrodes of the at least one switching thin film transistor are disconnectedly provided in the separation space between the first divided electrode and the second divided electrode.

21. The transparent display device according to claim 20, wherein the capacitor includes:
a first capacitor disposed in the first pixel circuit area and connected to the first circuit connection electrode;
a second capacitor disposed in the second pixel circuit area and connected to the second circuit connection electrode; and
a capacitor connection portion configured to connect the first and second capacitors to each other through the gate electrode of the driving thin film transistor and configured to include a narrow-width portion whose width is narrowed in a portion overlapped with the separation space in comparison to the first and second capacitors, wherein the narrow-width portion of the capacitor connection portion is disposed in one side or the other side of a width direction of the capacitor connection portion or is disposed in the center of the width direction of the pixel circuit, and the sub-transmission area corresponds to the area which excludes a portion overlapped with the narrow-width portion of the capacitor connection portion in the separation space between the first divided electrode and the second divided electrode.

22. The transparent display device according to claim 20, wherein the capacitor includes:

a first capacitor disposed in the first pixel circuit area and connected to the first circuit connection electrode;

a second capacitor disposed in the second pixel circuit area and connected to the second circuit connection electrode; and a capacitor connection portion configured to connect the first and second capacitors to each other through a conductive active layer and configured to include a transparent conductive layer made of the conductive active layer in a portion overlapped with the separation space, wherein the sub-transmission area includes a portion overlapped with the capacitor connection portion in the separation space.

23. The transparent display device according to claim 22, wherein a light shielding layer is not disposed in the portion overlapped with the separation space.

* * * * *